(12) United States Patent
Fujita et al.

(10) Patent No.: US 10,505,645 B2
(45) Date of Patent: Dec. 10, 2019

(54) WIRELESS COMMUNICATION DEVICE AND DETERMINATION METHOD

(71) Applicant: Renesas Electronics Corporation, Tokyo (JP)

(72) Inventors: Suguru Fujita, Tokyo (JP); Masakatsu Yokota, Tokyo (JP); Daisuke Oshida, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 4 days.

(21) Appl. No.: 15/954,686

(22) Filed: Apr. 17, 2018

(65) Prior Publication Data

US 2018/0343070 A1   Nov. 29, 2018

(30) Foreign Application Priority Data

May 23, 2017   (JP) .................................. 2017-101395
Sep. 12, 2017   (JP) .................................. 2017-174897

(51) Int. Cl.
| | |
|---|---|
| *H04B 17/14* | (2015.01) |
| *H05K 1/18* | (2006.01) |
| *H05K 1/14* | (2006.01) |
| *H04B 17/17* | (2015.01) |
| *G01R 31/40* | (2014.01) |
| *G01R 19/165* | (2006.01) |
| *H04B 17/00* | (2015.01) |
| *H04B 1/3822* | (2015.01) |

(52) U.S. Cl.
CPC ....... *H04B 17/14* (2015.01); *G01R 19/16538* (2013.01); *G01R 31/40* (2013.01); *H04B 17/0085* (2013.01); *H04B 17/17* (2015.01); *H05K 1/14* (2013.01); *H05K 1/181* (2013.01); *H04B 1/3822* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,114,955 A | * | 9/2000 | Brunius | H04B 17/20 340/286.02 |
| 7,366,508 B2 | | 4/2008 | Hasegawa et al. | |
| 2004/0148580 A1 | * | 7/2004 | de Obaldia | H04B 17/0085 714/715 |
| 2008/0182523 A1 | | 7/2008 | Toyoda | |
| 2018/0254795 A1 | * | 9/2018 | Beamish | H04B 1/525 |

FOREIGN PATENT DOCUMENTS

| | | |
|---|---|---|
| JP | 2005-151189 A | 6/2005 |
| JP | 2008-177680 A | 7/2008 |

* cited by examiner

Primary Examiner — Junpeng Chen
(74) Attorney, Agent, or Firm — Mattingly & Malur, PC

(57) ABSTRACT

To discriminate between a circuit where a failure does not occur and a circuit where a failure might occur, a wireless communication device has tested units which belong to a transmission side circuit, tested units which belong to a reception side circuit, a test signal generation unit for generating a test signal, a test signal reception unit for receiving a test signal, a test signal determination unit for determining whether or not the test signal received by the test signal reception unit is normal, and test signal transfer units for transferring a test signal from the transmission side circuit to the reception side circuit.

20 Claims, 22 Drawing Sheets

FIG. 5

DAC 201 IS IN FAILURE, AND ADC 202 IS NORMAL

| | |
|---|---|
| SWITCH 301/302 | TEST PERIOD |
| TS1 | 1 0 1 0 1 0 1 0 1 0 1 0 1 0 1 0 1 0 1 0 |
| TS2 | |
| TS3 | |
| Pmonitor | |
| Pdet | |
| INPUT OF ADC 202 | |
| TSr | 0 0 0 0 0 0 0 0 0 0 0 0 0 0 0 0 0 0 0 0 |
| CORRELATION RESULT BETWEEN TS1 AND TSr | 0 1 0 1 0 1 0 1 0 1 0 1 0 1 0 1 0 1 0 1 |

FIG. 20
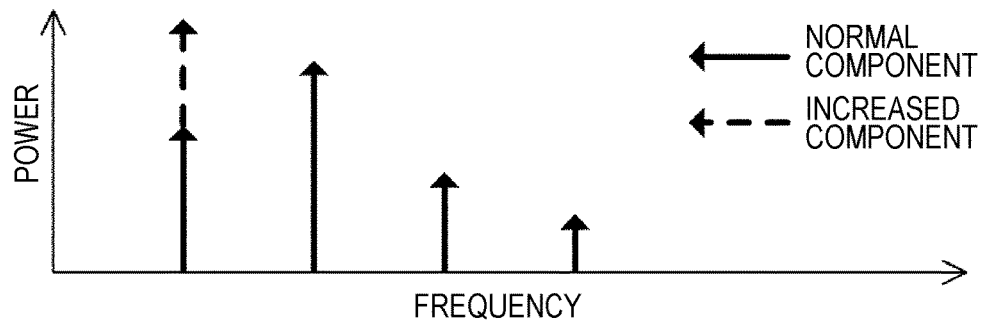
FIG. 21
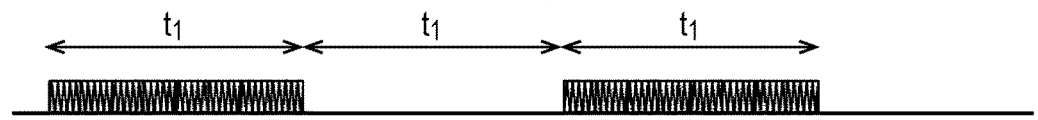
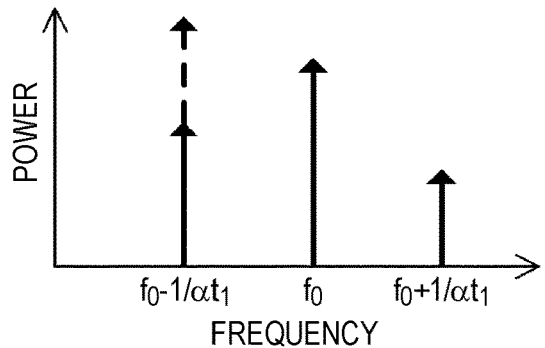
FIG. 22
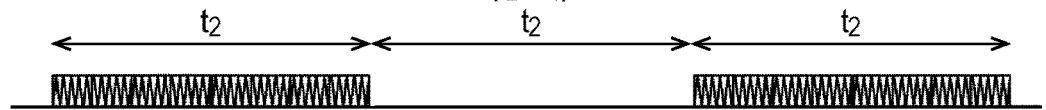
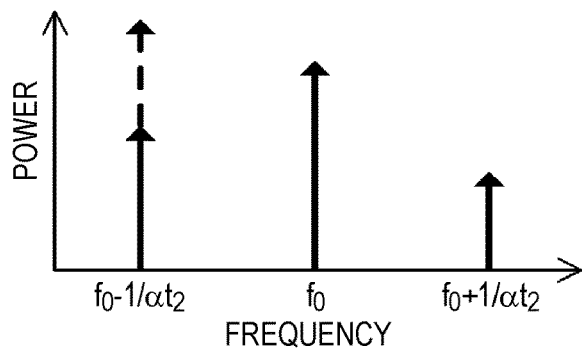

WIRELESS COMMUNICATION DEVICE AND DETERMINATION METHOD

CROSS-REFERENCE TO RELATED APPLICATIONS

The disclosures of Japanese Patent Application No. 2017-101395 filed on May 23, 2017 and No. 2017-174897 filed on Sep. 12, 2017 including the specification, drawings and abstract are incorporated herein by reference in its entirety.

BACKGROUND

The present invention relates to a wireless communication device and a determination method, and more particularly, to a wireless communication device and a determination method that use a test signal.

There is known a technique for detecting a failure of a wireless communication device. For example, Japanese Unexamined Patent Publication No. 2005-151189 (Patent Document 1) and Japanese Unexamined Patent Publication No. 2008-177680 (Patent Document 2) disclose techniques for inputting a signal from a transmission circuit to a reception circuit and thereby detecting a failure of a wireless communication device including these circuits.

SUMMARY

In the failure detection techniques described in Patent Documents 1 and 2, a transmission signal at an antenna feed end is inputted to a reception side, and the signal is detected on the reception side, thereby simply detecting the failure. Therefore, only the presence or absence of the failure is detected, and there is a problem that it is not possible to specify which circuit part is in failure.

The other problems and novel features will become apparent from the description of this specification and the accompanying drawings.

According to one embodiment, a wireless communication device has a first tested unit and a third tested unit which belong to a transmission side circuit, a second tested unit and a fourth tested unit which belong to a reception side circuit, a test signal reception unit, a test signal determination unit for determining whether or not a test signal received by the test signal reception unit is normal, and a first test signal transfer unit and a second test signal transfer unit for transferring a test signal from the transmission side circuit to the reception side circuit.

According to the one embodiment, it is possible to discriminate between a circuit where a failure does not occur and a circuit where a failure might occur.

BRIEF DESCRIPTION OF THE DRAWINGS

FIG. 5 is a time chart showing an example in which the DAC 201 is in failure.

FIG. 20 is a graph showing an example of frequency components changed due to removal in the attachment of the shield.

FIG. 21 is a schematic diagram showing the relationship between the time-base waveform and frequency component of a test signal.

FIG. 22 is a schematic diagram showing the relationship between the time-base waveform and frequency component of the test signal.

DETAILED DESCRIPTION

Figure 1:
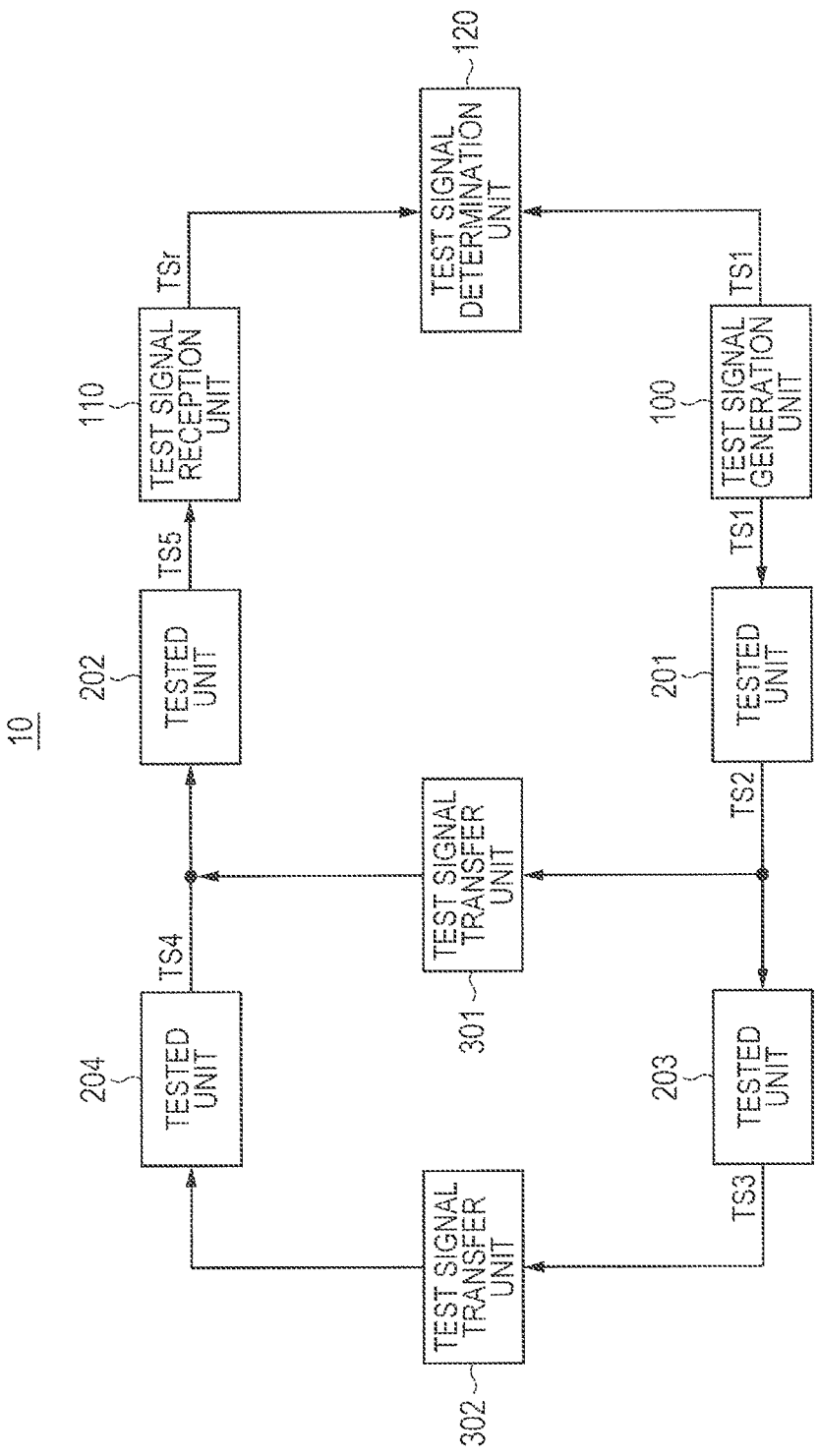
FIG. 1 is a block diagram showing the configuration of a wireless communication device according to a first embodiment.

To clarify the explanation, appropriate omission and simplification are made in the following description and drawings. In the drawings, the same elements are denoted by the same reference numerals, and their explanation will not be repeated as necessary.

First Embodiment

FIG. 1 is a block diagram showing the configuration of a wireless communication device 10 according to a first embodiment. The wireless communication device 10 has a test signal generation unit 100, a test signal reception unit 110, a test signal determination unit 120, tested units 201 to 204, and test signal transfer units 301 to 302.

The wireless communication device 10 is a device for transmitting and receiving wireless signals, and includes a circuit used to transmit a wireless signal and a circuit used to receive a wireless signal. The tested units 201, 203 are circuits belonging to a transmission side circuit, and the tested units 202, 204 are circuits belonging to a reception side circuit.

The tested units 201 to 204 are arbitrary circuits used to transmit or receive the wireless signal. The tested unit 201 is, for example, a digital-to-analog converter for converting a digital signal to an analog signal. The tested unit 202 is, for example, an analog-to-digital converter for converting an analog signal to a digital signal. The tested unit 203 is, for example, a transmission amplifier for amplifying a transmission signal. The tested unit 204 is, for example, a reception amplifier for amplifying a reception signal. The tested units 201 to 204 may be mere signal lines.

The test signal generation unit 100 is a circuit for generating a test signal. The test signal generation unit 100 generates the test signal in accordance with a predetermined generation rule or a designated generation rule. The test signal generation unit 100, for example, performs modulation processing such as phase shift keying on the generated test signal, and outputs the test signal. The test signal TS1 generated by the test signal generation unit 100 is inputted to the tested unit 201. The digital signal outputted from the test signal generation unit 100 is converted into the analog signal by the tested unit 201. Further, the test signal generation unit 100 also outputs the generated test signal to the test signal determination unit 120.

A test signal TS2 outputted by the tested unit 201 is inputted to the tested unit 203. The tested unit 203, for example, amplifies the test signal TS2, and outputs the amplified signal. A test signal TS3 outputted by the tested unit 203 is inputted through the test signal transfer unit 302 to the tested unit 204. The tested unit 204, for example, amplifies the test signal TS3, and outputs the amplified signal. A test signal TS4 outputted by the tested unit 204 or the test signal TS2 through the test signal transfer unit 301 is inputted to the tested unit 202. The analog signal inputted to the tested unit 202 is converted into the digital signal by the tested unit 202.

The test signal transfer units 301, 302 are circuits for transferring the test signal from the transmission side circuit to the reception side circuit. Further, the test signal transfer units 301, 302 can switch whether or not to transfer the test signal from the transmission side circuit to the reception side circuit. The test signal transfer units 301, 302 each are, for example, a transfer circuit including a switch, a coupler, or a variable attenuator. The test signal transfer unit 301 performs feedback so as to branch the test signal TS2 inputted from the tested unit 201 to the tested unit 203 and input the test signal TS2 to the tested unit 202. The test signal transfer unit 302 performs feedback so as to input the test signal TS3 outputted from the tested unit 203 to the tested unit 204.

The test signal reception unit 110 is a circuit for receiving the test signal, and a test signal TS5 which is a test signal outputted by the tested unit 202 is inputted to the test signal reception unit 110. The test signal reception unit 110, for example, performs demodulation processing on the inputted test signal, and outputs a test signal TSr.

The test signal determination unit 120 is an arithmetic circuit for determining whether or not the test signal received by the test signal reception unit 110 is normal.

More specifically, for example, the test signal determination unit 120 compares the test signal received by the test signal reception unit 110 with the test signal outputted by the test signal generation unit 100, and thereby determines whether or not the test signal reception unit 110 has correctly received the signal corresponding to the test signal TS1 outputted by the test signal generation unit 100. More specifically, for example, the test signal determination unit 120 determines whether or not the signal value of the test signal outputted by the test signal generation unit 100 matches the signal value of the test signal received by the test signal reception unit 110. Then, if the two values do not match, the test signal determination unit 120 detects that a failure occurs in a circuit on the transfer path of the test signal. The test signal determination unit 120 may detect the failure by determining whether or not the test signal received by the test signal reception unit 110 is within a predetermined signal strength range when the test signal generation unit 100 outputs the test signal of a prescribed signal strength. In this case, if the signal strength of the received test signal is out of the predetermined signal strength range, the test signal determination unit 120 detects that a failure occurs in a circuit on the transfer path of the test signal. The predetermined signal strength range corresponds to the signal strength of the test signal received by the test signal reception unit 110 when the tested units operate normally (that is, operate in the state of no occurrence of a failure).

The test signal determination unit 120 determines the test signal TSr fed back through the test signal transfer unit 301, and determines the test signal TSr fed back through the test signal transfer unit 302. Hereinafter, the test signal TSr fed back through the test signal transfer unit 301 is referred to as a test signal TSr1, and the test signal TSr fed back through the test signal transfer unit 302 is referred to as a test signal TSr2.

For example, if a failure occurs only in the tested unit 201 or 202, it is determined that both the test signals TSr1 and TSr2 are abnormal. On the other hand, for example, if a failure occurs only in the tested unit 203 or 204, it is determined that the test signal TSr1 is normal and the test signal TSr2 is abnormal.

That is, according to the wireless communication device 10 according to this embodiment, if it is determined that the test signal TSr1 is abnormal and the test signal TSr2 is also abnormal, it can be specified that the tested unit 201 or 202 is a failure part. In other words, in this case, it can be judged that the tested units 203 and 204 are circuits where the failure does not occur and the tested unit 201 or 202 is a circuit where the failure might occur.

On the other hand, if it is determined that the test signal TSr1 is normal and the test signal TSr2 is abnormal, it can be specified that the tested unit 203 or 204 is a failure part. In other words, in this case, it can be judged that the tested units 201 and 202 are circuits where the failure does not occur and the tested unit 203 or 204 is a circuit where the failure might occur.

The failure part may be specified by the test signal determination unit 120 or by another determination unit (not shown) that receives the determination result of the test signal determination unit 120.

Thus, the first embodiment has been described. The wireless communication device 10 according to the first embodiment has a plurality of loopback circuits for the test signal (a loopback circuit through the test signal transfer unit 301 and a loopback circuit through the test signal transfer unit 302). Therefore, it is possible to discriminate between the circuit where the failure does not occur and the circuit where the failure might occur, based on whether or not the test signal passing through the corresponding loopback circuit is abnormal.

Figure 2:
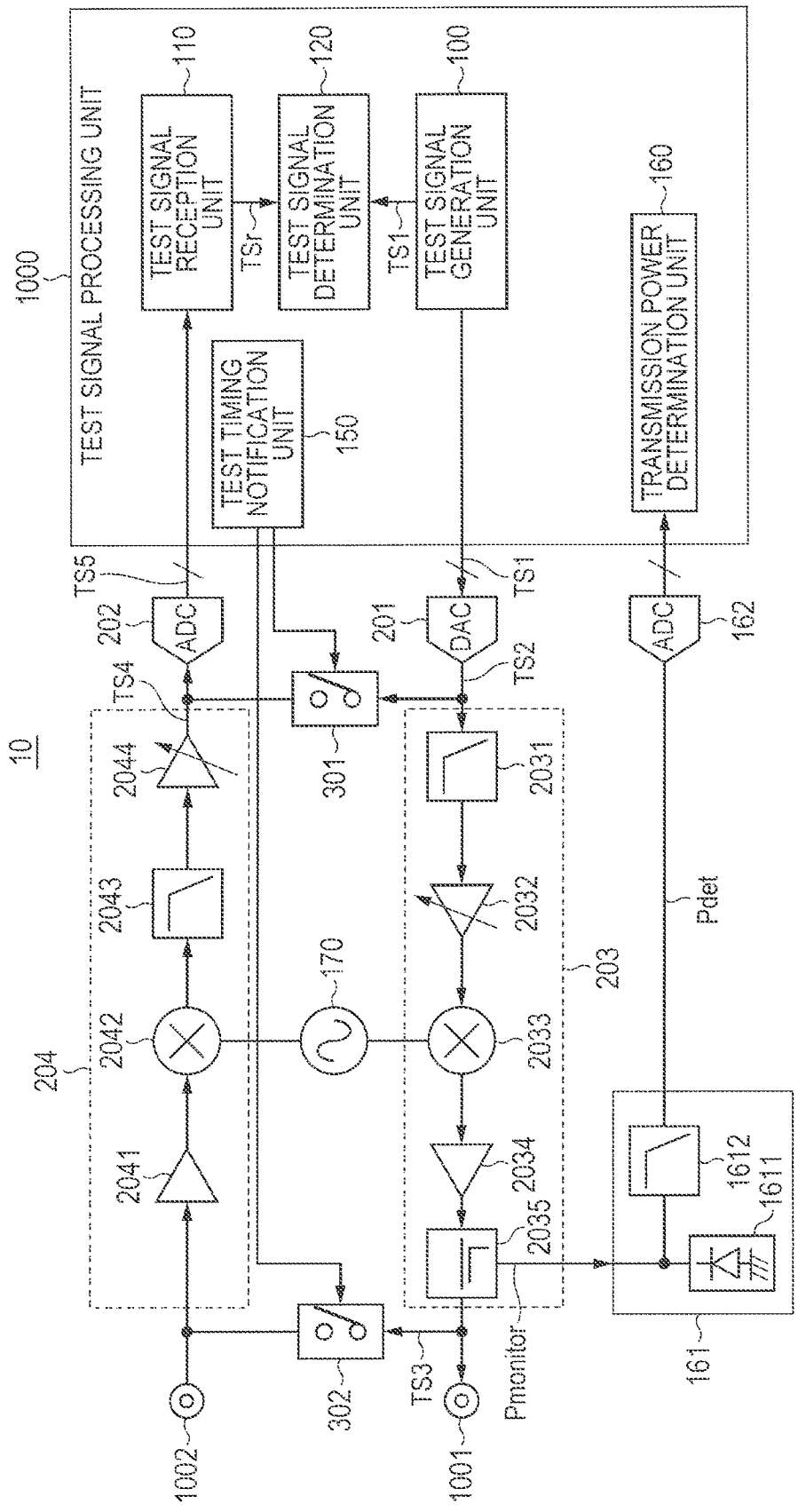
FIG. 2 is a diagram showing the circuit configuration of the wireless communication device according to the first embodiment.

An example of the specific actual circuits of the tested units etc. will be described. FIG. 2 is a diagram showing the circuit configuration of the wireless communication device 10.

In the circuit configuration shown in FIG. 2, the wireless communication device 10 has a test signal processing unit 1000 including the test signal generation unit 100, the test signal reception unit 110, the test signal determination unit 120, a test timing notification unit 150, and a transmission power determination unit 160.

Further, the wireless communication device 10 has a digital-to-analog converter 201 (hereinafter referred to as a DAC 201) corresponding to the tested unit 201, an analog-to-digital converter 202 (hereinafter referred to as an ADC 202) corresponding to the tested unit 202, a circuit group corresponding to the tested unit 203, a circuit group corresponding to the tested unit 204, a switch 301 corresponding to the test signal transfer unit 301, and a switch 302 corresponding to the test signal transfer unit 302. Specifically, the circuit group corresponding to the tested unit 203 includes a low-pass filter 2031 (hereinafter referred to as an LPF 2031), a variable gain amplifier 2032 (hereinafter referred to as a VGA 2032), a mixer 2033, a power amplifier 2034, and a coupler 2035. The circuit group corresponding to the tested unit 204 includes a low noise amplifier 2041 (LNA 2041), a mixer 2042, a low-pass filter 2043 (hereinafter referred to as an LPF 2043), and a variable gain amplifier 2044 (hereinafter referred to as a VGA 2044).

Further, the wireless communication device 10 has a detector 161, an analog-to-digital converter 162 (hereinafter referred to as an ADC 162), and an oscillation circuit 170.

First, the transmission side circuit will be described. The test signal TS1 outputted by the test signal generation unit 100 is converted from digital to analog by the DAC 201, and outputted as the test signal TS2 from the DAC 201. The test signal TS2 is inputted to the tested unit 203. If the switch 301 is on, the test signal TS2 is inputted to the ADC 202. The signal outputted from the DAC 201 is inputted through the LPF 2031 to the VGA 2032, and the signal level is adjusted by the VGA 2032. The signal outputted from the VGA 2032 is superimposed by the mixer 2033 on a carrier signal outputted by the oscillation circuit 170. The signal outputted from the mixer 2033 is adjusted to a prescribed signal level by the power amplifier 2034. A part of the power of the signal outputted from the power amplifier 2034 is extracted by the coupler 2035. The extracted partial signal component (signal Pmonitor) is inputted to the detector 161, and the remaining signal component is outputted from the tested unit 203. The signal (test signal TS3) outputted from the tested unit 203 is outputted from an output terminal 1001. If the switch 302 is on, the signal is inputted to the tested unit 204.

Next, the reception side circuit will be described. A signal inputted to an input terminal 1002 or the signal transferred through the switch 302 is inputted through the LNA 2041 of the tested unit 204 to the mixer 2042. The high-frequency component of the signal inputted to the mixer 2042 is removed based on the carrier signal from the oscillation circuit 170. The signal outputted from the mixer 2042 is inputted through the LPF 2043 to the VGA 2044. The signal whose signal level is adjusted by the VGA 2044 is outputted as the test signal TS4 from the tested unit 204, and inputted to the ADC 202. The ADC 202 converts the inputted signal from analog to digital, and outputs the converted signal as the test signal TS5 to the test signal reception unit 110 of the test signal processing unit 1000.

Next, the test signal processing unit 1000 will be described. Since the test signal generation unit 100, the test signal reception unit 110, and the test signal determination unit 120 have been described with reference to FIG. 1, their description will not be repeated. The test timing notification unit 150 is a circuit for notifying a test timing to the switch 301 and the switch 302. More specifically, in the case of configuring the loopback circuit via the switch 301 for testing, the test timing notification unit 150 makes a notification so as to turn on the switch 301 and turn off the switch 302. In the case of configuring the loopback circuit via the switch 302 for testing, the test timing notification unit 150 makes a notification so as to turn off the switch 301 and turn on the switch 302. That is, it can be said that the test timing notification unit 150 is a control circuit for controlling switching between the switch 301 and the switch 302.

The transmission power determination unit 160 is a circuit for determining whether or not the power of the test signal TS3 outputted by the tested unit 203 is within a predetermined range. As described above, the signal Pmonitor which is a part of the signal outputted from the power amplifier 2034 is inputted to the detector 161. The detector 161 has a diode 1611 and a low-pass filter 1612, performs detection and rectification, and outputs a signal Pdet. The signal Pdet is converted by the ADC 162 from the analog signal to the digital signal, which is inputted to the transmission power determination unit 160. The coupler 2035, the detector 161, and the ADC 162 are referred to as a first power detection unit, which is a configuration for detecting the power of the test signal TS3 outputted by the tested unit 203. More specifically, the transmission power determination unit 160 determines whether or not the power detected by the first power detection unit is within the predetermined range. More specifically, the transmission power determination unit 160 determines whether or not the value outputted from the ADC 162 is within the prescribed range. Thereby, the transmission power determination unit 160 determines whether or not the power of the signal for transmission is normal.

Figure 3:
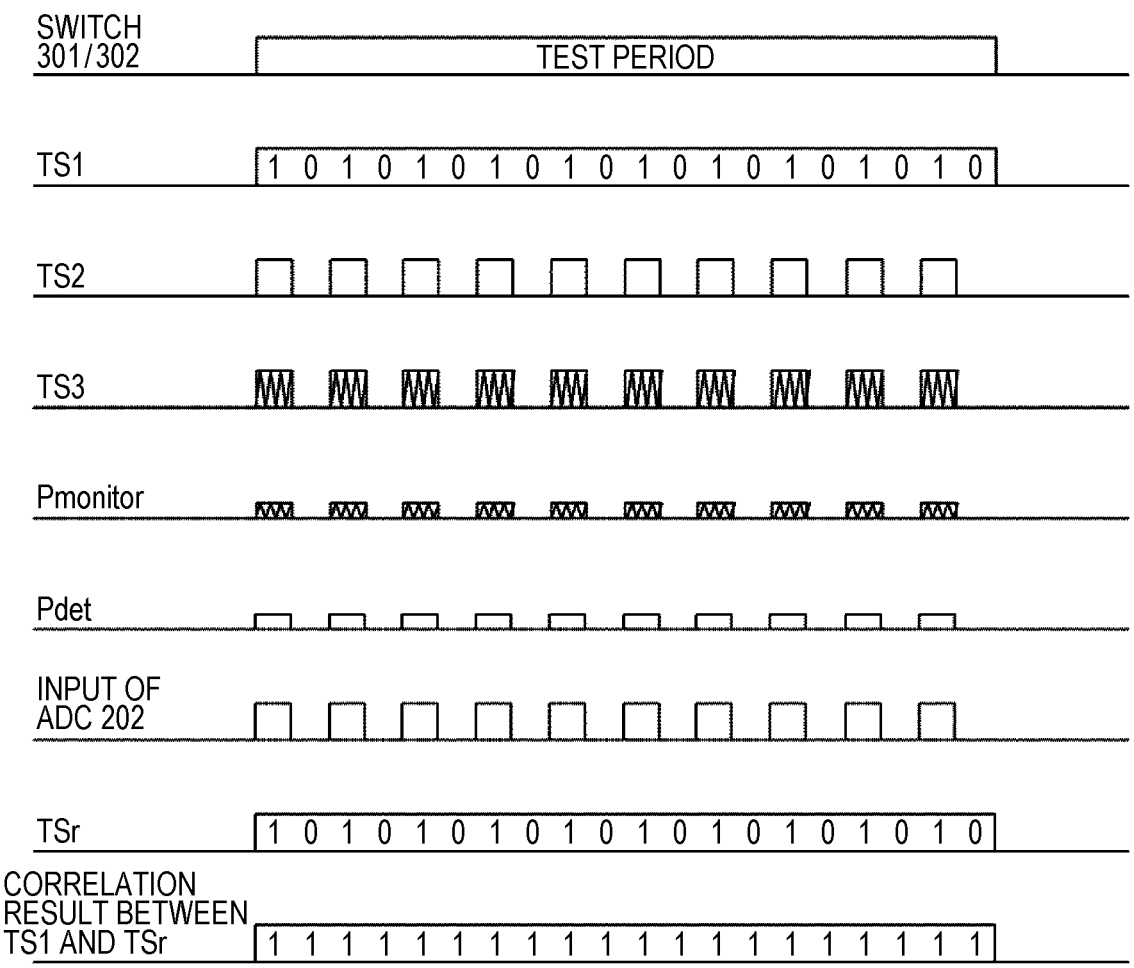
FIG. 3 is a time chart showing an example in which a DAC 201 and an ADC 202 are normal.

Next, failure detection by the wireless communication device 10 will be described with reference to time charts. The description will be made focusing particularly on the failure of the DAC 201 or the ADC 202. First, a time chart in the case where the DAC 201 and the ADC 202 are normal will be described. FIG. 3 shows an example of a time chart showing a case where the DAC 201 and the ADC 202 are normal. FIG. 3 is the time chart in the case where not only the DAC 201 and the ADC 202 but also all circuits on the transmission side and the reception side are normal.

When a test is performed, e.g., a signal of High is inputted to either the switch 301 or the switch 302 during a time shown as "test period" in FIG. 3. When the signal of High is inputted to the switch 301, the switch 301 is turned on, and the test signal passes through the switch 301. In the same way, when the signal of High is inputted to the switch 302, the switch 302 is turned on, and the test signal passes through the switch 302.

The test signal TS1 is, for example, a signal with repetition of 1 and 0. For example, in the case of OOK modulation, the output of the DAC 201 is outputted, with repetition of High and Low, as the test signal TS2 (hereinafter, the output of the DAC 201 is also referred to as a modulation baseband signal). The modulation baseband signal is superimposed on the carrier signal by the mixer 2033, and becomes the test signal TS3 including the high-frequency component. As described above, a part of the power of the test signal TS3 is extracted as the signal Pmonitor by the coupler 2035, and becomes the signal Pdet by the detector 161.

The test signal TS3 sent to the reception side circuit is converted by the mixer 2042 into a demodulation baseband signal, which is outputted as the test signal TS4 from the tested unit 204. This signal is converted into the test signal TS5 as the digital signal, which is inputted to the test signal reception unit 110 of the test signal processing unit 1000. The test signal reception unit 110 outputs the test signal TSr which is a signal string represented by 1 and 0. The test signal determination unit 120 performs correlation processing (comparison processing) between the test signal TS1 outputted from the test signal generation unit 100 and the test signal TSr outputted from the test signal reception unit 110.

If both the DAC 201 and the ADC 202 are normal, all the bits of the test signal TS1 and the test signal TSr are correlated (match) both when the switch 301 is turned on and when the switch 302 is turned on. In other words, if all the bits of the test signal TS1 and the test signal TSr are correlated (match) both when the switch 301 is turned on and when the switch 302 is turned on, the test signal determination unit 120 determines that all circuits on the transmission side and the reception side are normal.

Figure 4:
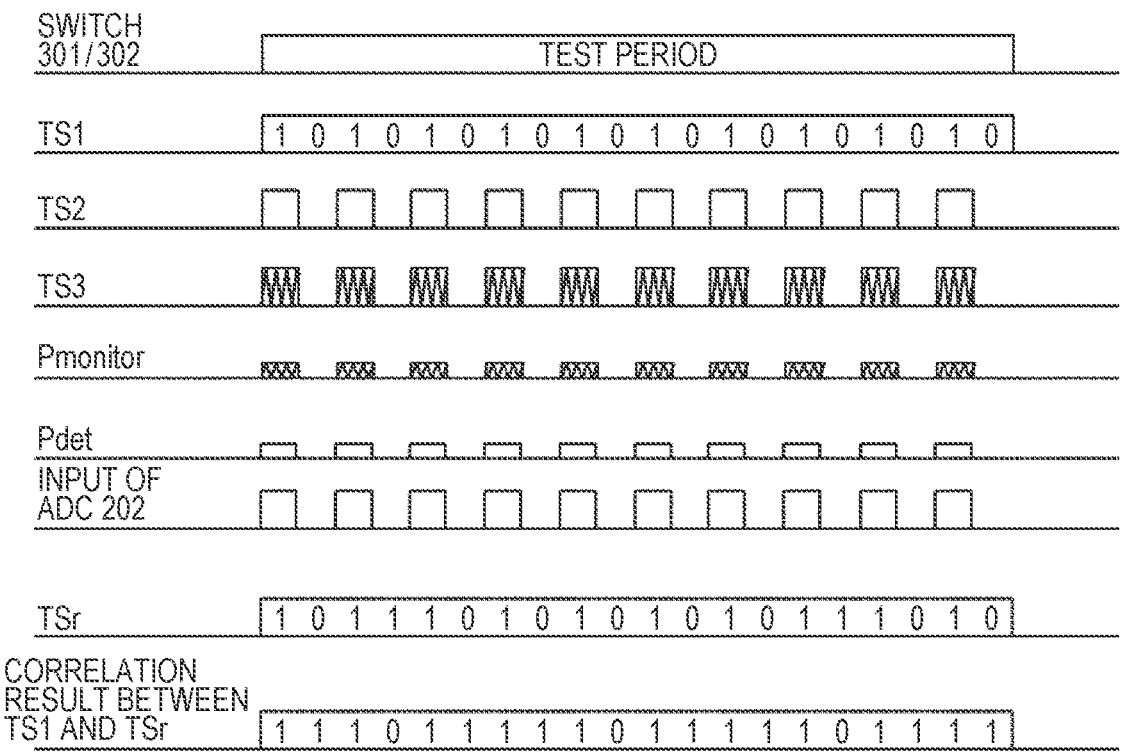
FIG. 4 is a time chart showing an example in which the ADC 202 is in failure.

Next, a time chart in the case where the ADC 202 is in failure will be described. FIG. 4 shows an example of a time chart showing a case where the ADC 202 is in failure. FIG. 4 is the time chart in the case where circuits other than the ADC 202 are normal.

The difference from the time chart shown in FIG. 3 is the signal string of the test signal TSr. While the test signal TSr is the signal string of e.g. 1010 . . . in the case where the ADC 202 is not in failure, a signal that is erroneously determined to be e.g. 1 instead of 0 is mixed in the test signal TSr in the case where the ADC 202 is in failure. This occurs regardless of whether the test signal passes through the switch 301 or the switch 302. That is, in both paths through the switch 301 and through the switch 302, there exists a bit where the correlation is not established at the test signal determination unit 120. This is because an error occurs in the last ADC 202 in spite of the propagation of the correct signal in both paths through the switch 301 and through the switch 302. In this case, since the signal Pdet is normal, it can be determined that the transmission system including the DAC 201 is normal. That is, it can be specified that the reception side circuit includes a failure part.

In the case where an error occurs only in 0s, it can be determined that a failure occurs only in a low-order bit conversion circuit in the ADC 202. Needless to say, in the case where an error occurs only in 1s, it can be determined that a failure occurs in a high-order bit conversion circuit in the ADC 202.

Next, a time chart in the case where the DAC 201 is in failure will be described. FIG. 5 shows an example of a time chart showing a case where the DAC 201 is in failure. FIG. 5 is the time chart in the case where circuits other than the DAC 201 are normal. In this case, since the circuit for outputting the modulation baseband signal is in failure, the test signal TS2, the test signal TS3, and the signal Pmonitor are, for example, not outputted. As a result, the transmission power determination unit 160 determines that the signal Pdet is abnormal in terms of power. Further, in the reception side circuit as well, the test signal TS4 is not outputted. In the signal string of the test signal TSr, due to OOK modulation in this example, 0 remains 0, but the signal that is originally 1 also becomes 0. Therefore, bits where the correlation is not established exist in the correlation result.

In such a case, since in both paths through the switch 301 and through the switch 302, the correlation is not established, and the signal Pdet is abnormal, it can be determined that the DAC 201 is in failure.

Thus, as described with reference to FIGS. 4 and 5, by considering the determination result of the transmission power determination unit 160, it can be specified whether the transmission side circuit or the reception side circuit includes the failure part. The failure part may be specified by the test signal determination unit 120 by receiving the determination result of the transmission power determination unit 160, or by another determination unit (not shown) that receives the determination result of the test signal determination unit 120 and the determination result of the transmission power determination unit 160.

Figure 6:
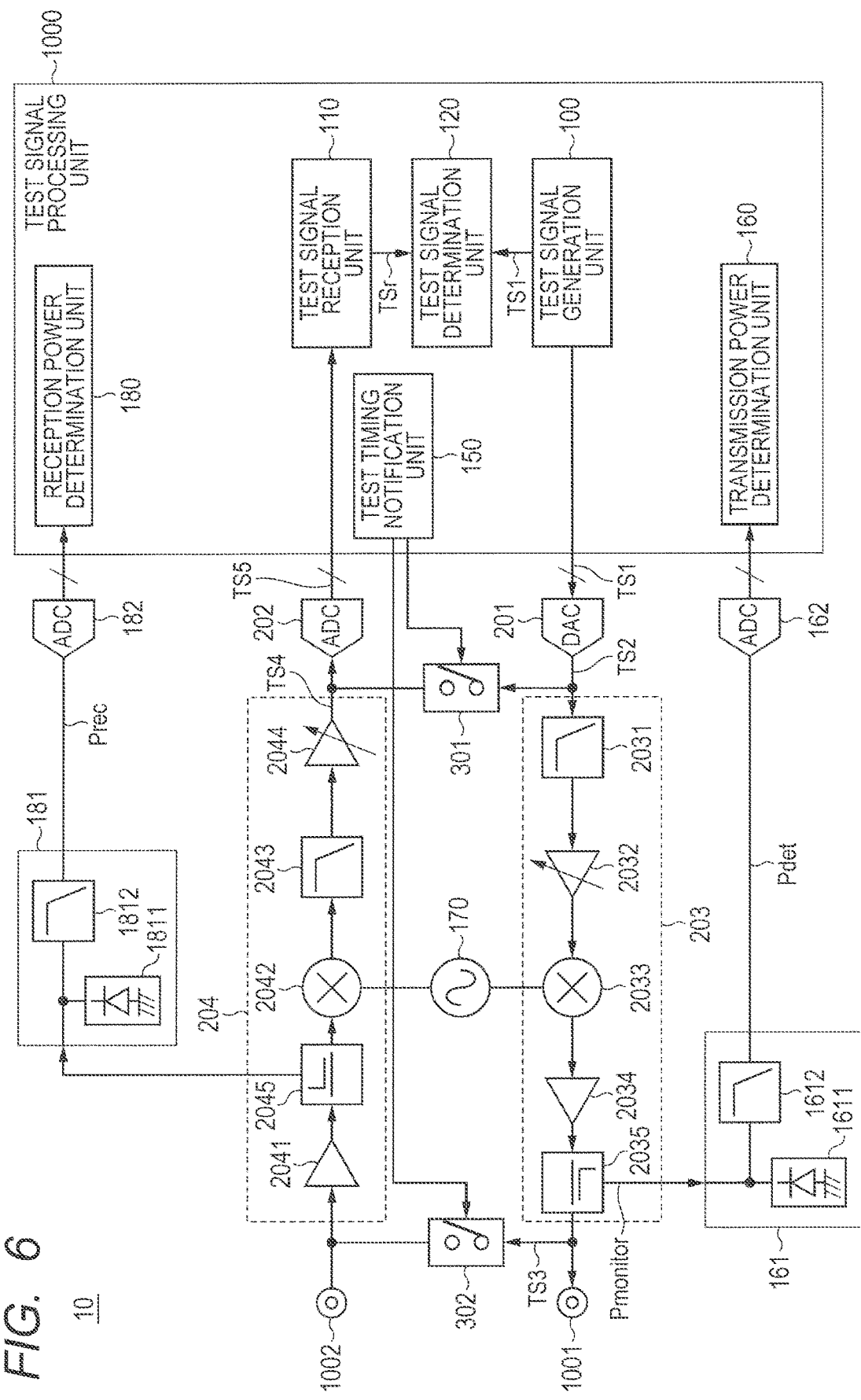
FIG. 6 is a diagram showing the circuit configuration of the wireless communication device including a configuration for determining the power of a signal passing through a tested unit 204.

While the description has been made by way of example of OOK modulation, another arbitrary modulation method such as phase shift keying can also be used for failure detection. Further, while the configuration for determining the power of the signal passing through the tested unit 203 on the transmission side is shown in the above description, the wireless communication device 10 may include a configuration for determining the power of the signal passing through the tested unit 204 on the reception side. FIG. 6 is a diagram showing the circuit configuration of the wireless communication device 10 including the configuration for determining the power of the signal passing through the tested unit 204. Hereinafter, the different points of the configuration shown in FIG. 6 from the configuration shown in FIG. 2 will be mainly described.

In the configuration of the wireless communication device 10 shown in FIG. 6, a coupler 2045 is added to the tested unit 204, a reception power determination unit 180 is added to the test signal processing unit 1000, and a detector 181 including a diode 1811 and a low-pass filter 1812 and an analog-to-digital converter 182 (hereinafter referred to as an ADC 182) are added.

The coupler 2045 is coupled between the LNA 2041 and the mixer 2042. A part of the power of the signal outputted from the LNA 2041 is extracted by the coupler 2045. The extracted partial signal component is inputted to the detector 181, and the remaining signal component is inputted to the mixer 2042. A signal Prec which is a signal outputted from the detector 181 is converted by the ADC 182 from the analog signal to the digital signal, which is inputted to the reception power determination unit 180. The reception power determination unit 180 is a circuit for determining whether or not the power of the test signal passing through the tested unit 204 (more practically, the test signal outputted by the LNA 2041) is within a predetermined range. The coupler 2045, the detector 181, and the ADC 182 are referred to as a second power detection unit, which is a configuration for detecting the power of the test signal transferred in the tested unit 204. Therefore, the reception power determination unit 180 determines whether or not the power detected by the second power detection unit is within the predetermined range. More specifically, the reception power determination unit 180 determines whether or not the value outputted from the ADC 182 is within the prescribed range. Thereby, the reception power determination unit 180 determines whether or not the power of the signal for reception is normal.

Figure 7:
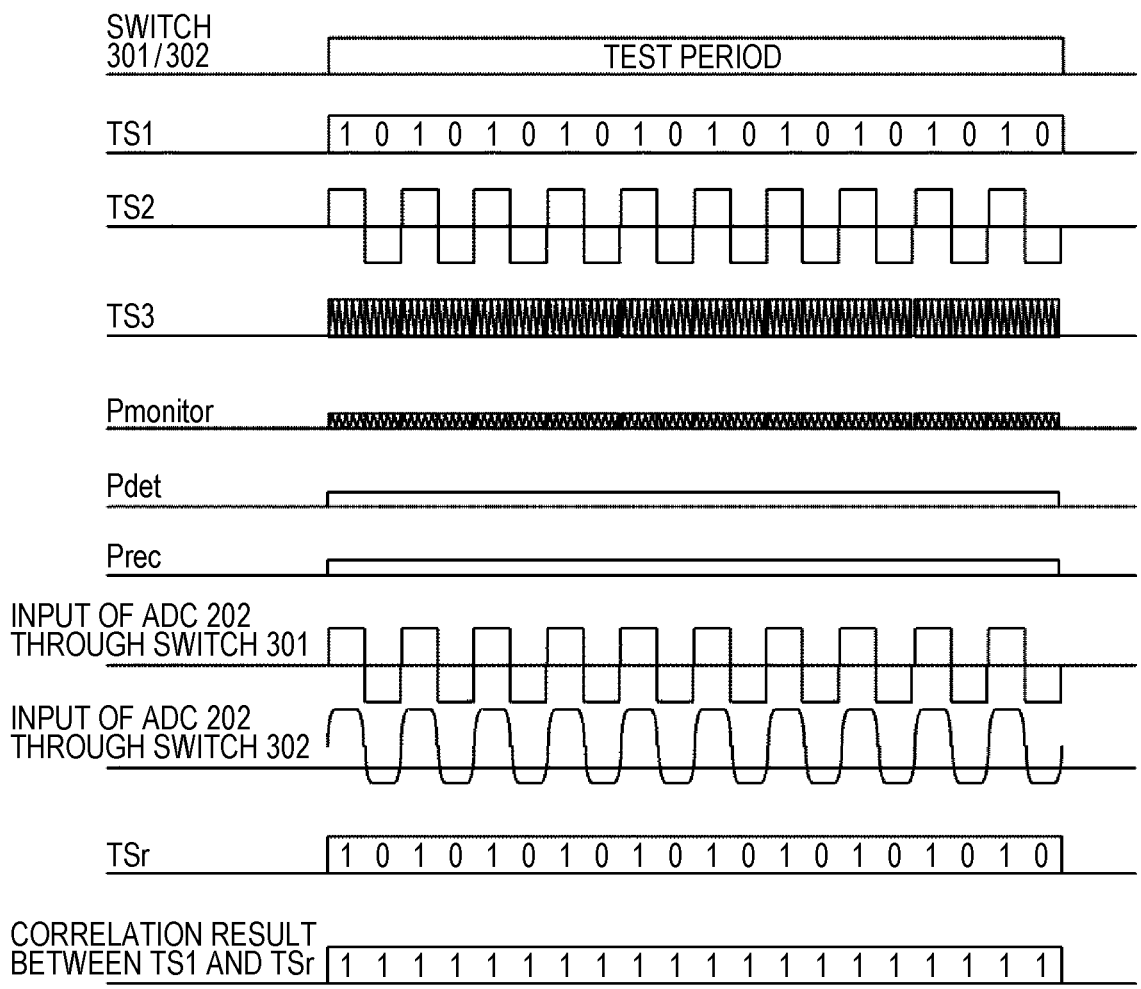
FIG. 7 is a time chart showing an example in which a tested unit 203 and the tested unit 204 are normal.

Next, failure detection by the wireless communication device 10 having the configuration shown in FIG. 6 will be described with reference to time charts. First, a time chart in the case where the tested unit 203 and the tested unit 204 are normal will be described. FIG. 7 shows an example of a time chart showing a case where the tested unit 203 and the tested unit 204 are normal. FIG. 7 is the time chart in the case where not only the tested unit 203 and the tested unit 204 but also all circuits on the transmission side and the reception side are normal. Although the following description will be made by way of example of BPSK modulation, another arbitrary modulation method may be used.

In the case of BPSK modulation, that is, in the case where the test signal TS2 is a BPSK modulated signal, information of 1 and 0 is expressed by the phase, unlike the OOK modulation. Therefore, the test signal TS3 is a continuous high-frequency signal of constant amplitude. Due to this difference, the time chart shown in FIG. 7 is different in waveform from the time chart shown in FIG. 3; however, as in FIG. 3, all the bits of the test signal TS1 and the test signal TSr are correlated (match) both when the switch 301 is turned on and when the switch 302 is turned on. Further, it is determined that the signal Pdet and the signal Prec are normal.

Figure 8:
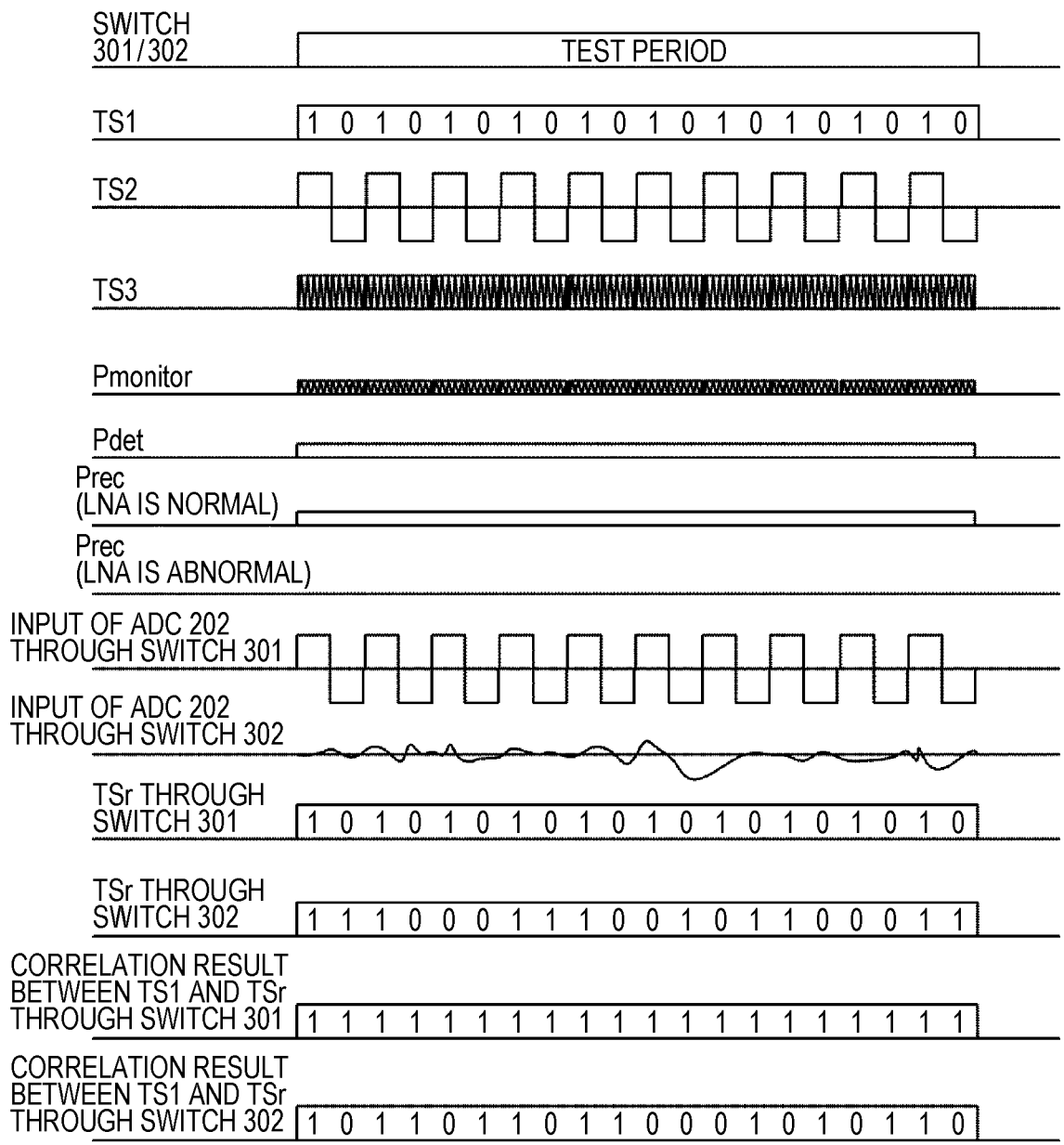
FIG. 8 is a time chart showing an example in which the tested unit 204 is in failure.

Next, a time chart in the case where the tested unit 204 is in failure will be described. FIG. 8 shows an example of a time chart showing a case where the tested unit 204 is in failure. FIG. 8 is the time chart in the case where circuits other than the tested unit 204 are normal.

In this case, the test signal (test signal TS2) inputted to the ADC 202 through the path of the switch 301 is a normal signal, but the test signal (test signal TS4) inputted to the ADC 202 through the path of the switch 302 is not a normal signal and is a random noise signal. Accordingly, the test signal TSr through the switch 302 is a signal string in which 1s and 0s are randomly arranged. Therefore, while the correlation between the test signal TSr1 (i.e., the test signal TSr through the switch 301) and the test signal TS1 is established, an error randomly occurs in the correlation result between the test signal TSr2 (i.e., the test signal TSr through the switch 302) and the test signal TS1. In this case, since the transmission side circuit is normal, it is determined that the signal Pdet is normal.

Therefore, from the determination result of the test signal determination unit 120 and the determination result of the transmission power determination unit 160, it is possible to specify the failure part as follows. That is, since the reception data through the path of the switch 301 is normal and the signal Pdet is normal, it can be determined that the tested unit 204 in the reception side circuit is in failure. Further, by using the determination result of the reception power determination unit 180, it is possible to further specify the failure part as follows. That is, if the signal Prec is normal, it can be specified that any of the mixer 2042, the LPF 2043, and the VGA 2044 is in failure. If the signal Prec is abnormal, it can be specified that the LNA 2041 is in failure.

Figure 9:
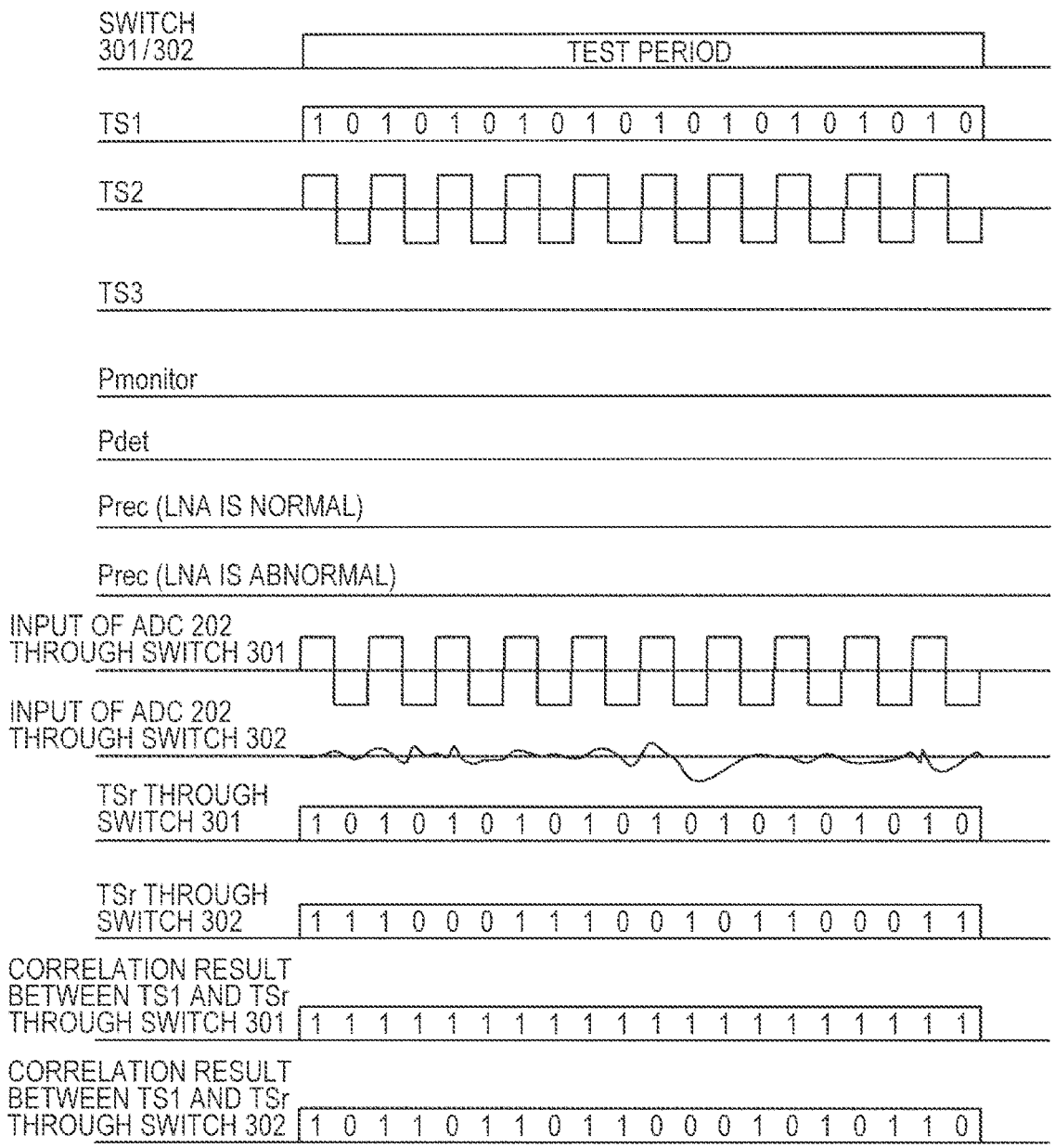
FIG. 9 is a time chart showing an example in which the tested unit 203 is in failure.

Next, a time chart in the case where the tested unit 203 is in failure will be described. FIG. 9 shows an example of a time chart showing a case where the tested unit 203 is in failure. FIG. 9 is the time chart in the case where circuits other than the tested unit 203 are normal.

In the case where the tested unit 203 is in failure, the test signal TS3, the signal Pmonitor, the signal Pdet, and the signal Prec are, for example, not outputted, as shown in FIG. 9. Accordingly, abnormality is determined by the transmission power determination unit 160 and the reception power determination unit 180. Further, the test signal (test signal TS2) inputted to the ADC 202 through the path of the switch 301 is a normal signal, but the test signal (test signal TS4) inputted to the ADC 202 through the path of the switch 302 is a random noise signal. Therefore, while the correlation between the test signal TSr1 (i.e., the test signal TSr through the switch 301) and the test signal TS1 is established, an error randomly occurs in the correlation result between the test signal TSr2 (i.e., the test signal TSr through the switch 302) and the test signal TS1.

Therefore, from the determination result of the test signal determination unit 120 and the determination result of the transmission power determination unit 160, it is possible to specify the failure part as follows. That is, since the reception data through the path of the switch 301 is normal and the signal Pdet is abnormal, it can be determined that the tested unit 203 in the transmission side circuit is in failure.

Thus, as described with reference to FIGS. 8 and 9, by considering the determination result of the transmission power determination unit 160, it can be specified whether the transmission side circuit or the reception side circuit includes the failure part. Further, by considering the determination result of the reception power determination unit 180, it is possible to specify which circuit in the tested unit 204 is in failure. The failure part may be specified by the test signal determination unit 120 by receiving the determination results of the transmission power determination unit 160 and the reception power determination unit 180, or by another determination unit (not shown) that receives the determination results of the test signal determination unit 120, the transmission power determination unit 160, and the reception power determination unit 180.

Second Embodiment

Figure 10:
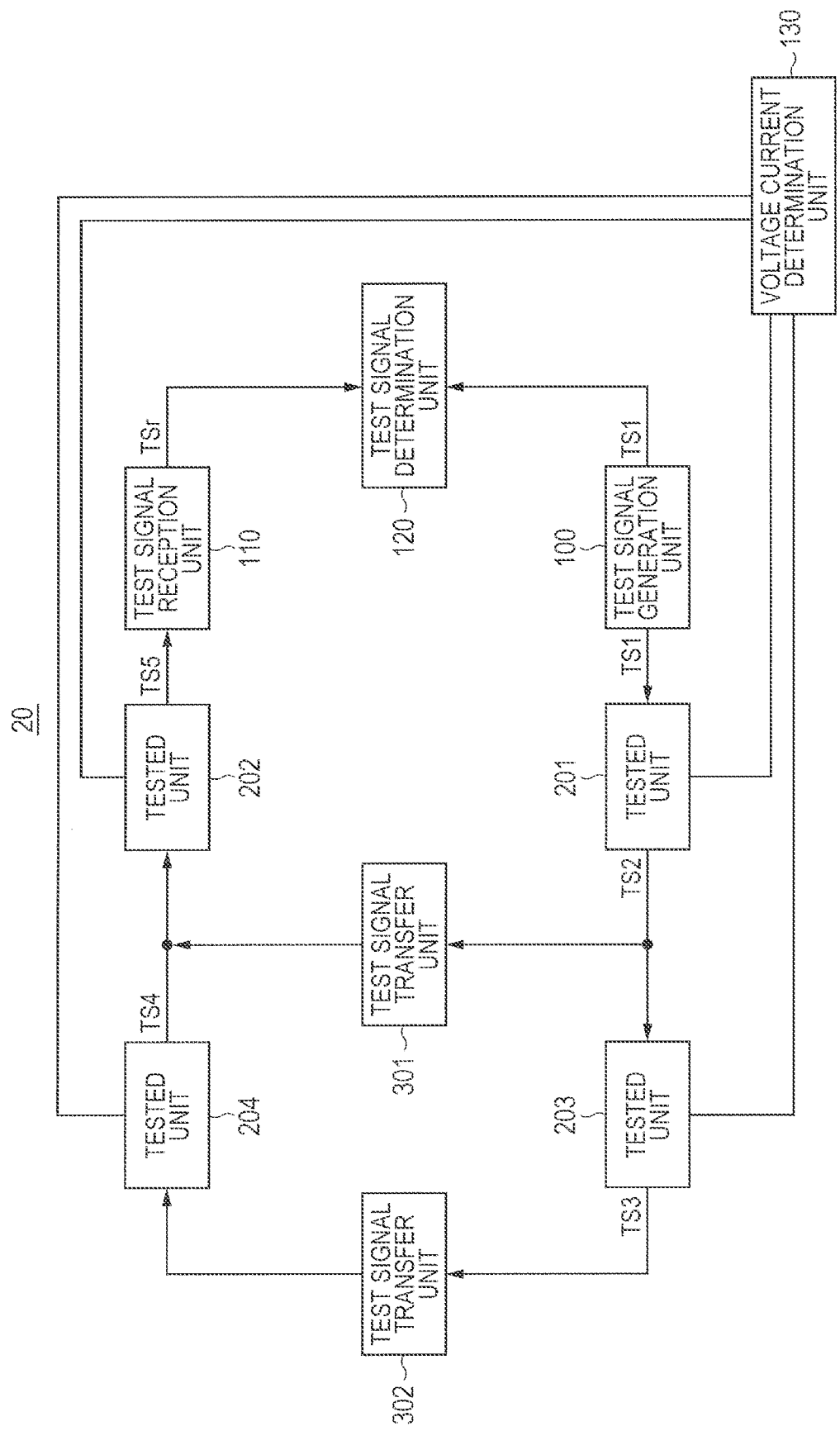
FIG. 10 is a block diagram showing the configuration of a wireless communication device according to a second embodiment.

The second embodiment differs from the first embodiment in that the failure of the tested units 201 to 204 is detected based on the power supply voltages of the tested units 201 to 204 or the consumption currents of the tested units 201 to 204. FIG. 10 is a block diagram showing the configuration of a wireless communication device 20 according to the second embodiment. The wireless communication device 20 is the same as the wireless communication device 10 according to the first embodiment, except that a voltage current determination unit 130 is added. The voltage current determination unit 130 is also referred to as a failure detection unit.

The voltage current determination unit 130 acquires the respective power supply voltages of the tested units 201 to 204, compares the respective power supply voltages of the tested units 201 to 204 with a predetermined voltage reference, and thereby detects the failure of the tested units 201 to 204. For example, the voltage current determination unit 130 monitors the power supply voltage of the tested unit 201 when the test signal is transferred, and determines that a failure occurs in the tested unit 201 if the power supply voltage is out of a power supply voltage reference range predetermined for the tested unit 201.

Further, the voltage current determination unit 130 acquires the respective consumption current amounts of the tested units 201 to 204, compares the respective consumption currents of the tested units 201 to 204 with a predetermined consumption current reference, and thereby detects the failure of the tested units 201 to 204. For example, the voltage current determination unit 130 monitors the consumption current of the tested unit 201 when the test signal is transferred, and determines that a failure occurs in the tested unit 201 if the consumption current is out of a consumption current reference range predetermined for the tested unit 201.

The voltage current determination unit 130 may perform either failure detection based on the power supply voltage or failure detection based on the consumption current. Further, in determination processing, the voltage current determination unit 130 does not need to perform determination on all the tested units 201 to 204 at the same time, but may perform determination on only some of them. Further, one voltage current determination unit 130 may be provided for each tested unit instead of being provided for a plurality of tested units.

For example, the voltage current determination unit 130 is electrically coupled to a terminal different from a signal output terminal provided for each of the tested units 201 to 204, and monitors the power supply voltage or the consumption current based on output from this terminal.

In the wireless communication device 20 according to the second embodiment, as described above, the voltage current determination unit 130 performs failure detection based on the power supply voltage or the consumption current for each tested unit. Therefore, it is possible to detect the occurrence of the failure for each tested unit.

While this embodiment shows the configuration including both the test signal determination unit 120 and the voltage current determination unit 130, a configuration not having the test signal determination unit 120 is also regarded as one embodiment. This embodiment may be combined with any of the later-described embodiments. That is, the voltage current determination unit 130 may perform determination on any of the tested units shown in the later-described embodiments.

Figure 11:
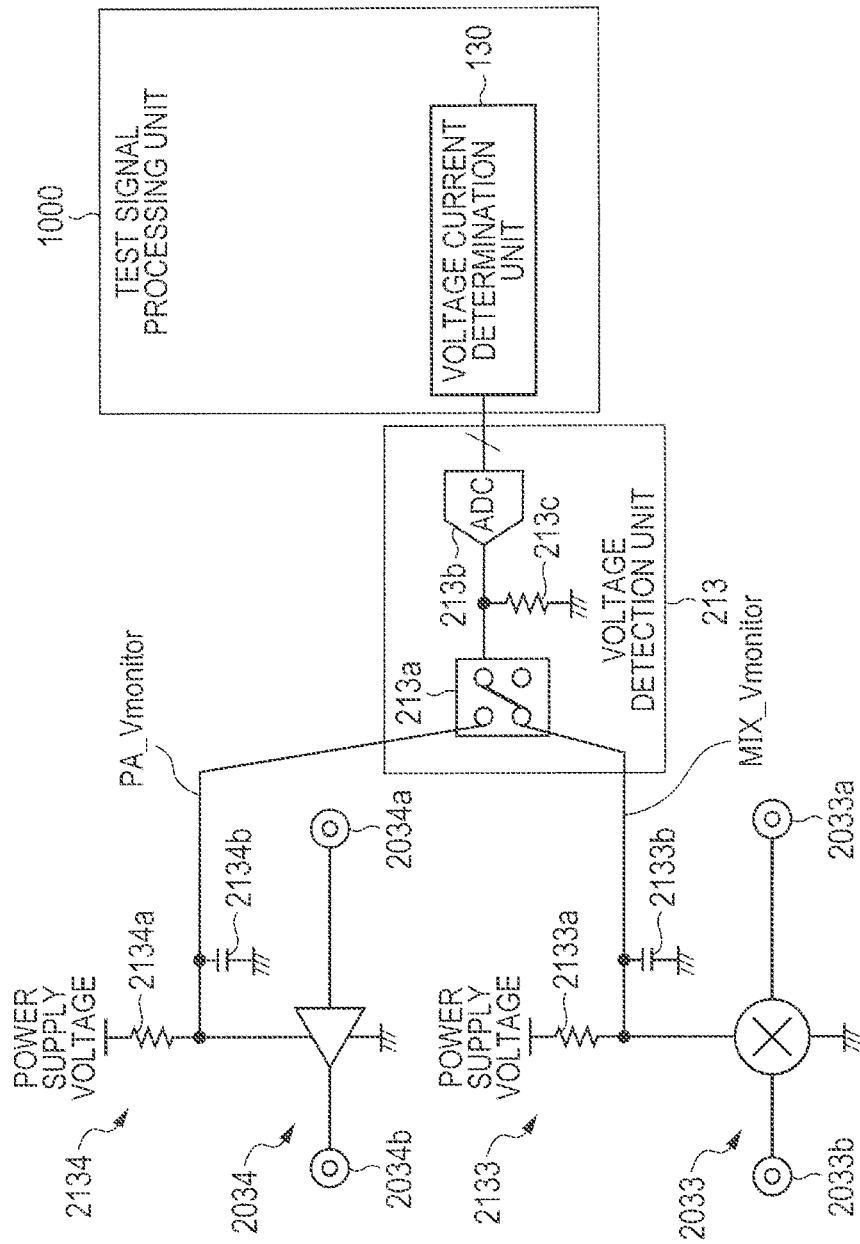
FIG. 11 is a diagram showing a circuit configuration for monitoring a power supply voltage.

The second embodiment will be further described showing an example of an actual circuit. For example, a power supply circuit is coupled to an active circuit such as the power amplifier or the mixer, and a current is supplied thereto. FIG. 11 is a diagram showing a circuit configuration for monitoring the power supply voltage. By way of example, FIG. 11 shows the circuit configuration focusing on the power amplifier 2034 and the mixer 2033. In FIG. 11, the voltage current determination unit 130 is provided in the test signal processing unit 1000. The other configurations in the test signal processing unit 1000 are not shown in FIG. 11.

The power amplifier 2034 includes an input terminal 2034a to which the signal is inputted and an output terminal 2034b from which the signal is outputted, and is coupled to a power supply circuit 2134. The power supply circuit 2134 includes a resistor 2134a for voltage division and a capacitor 2134b for removing the high-frequency component of the current supplied to the power amplifier 2034. A voltage divided by the power supply circuit 2134 is extracted as a signal PA_Vmonitor, and inputted to a switch 213a in a voltage detection unit 213. The capacitor 2134b may be a plurality of capacitors having different capacitances. That is, the power supply circuit 2134 may be configured so that each capacitor removes a frequency component corresponding to the capacitance.

The mixer 2033 includes an input terminal 2033a to which the signal is inputted and an output terminal 2033b from which the signal is outputted, and is coupled to a power supply circuit 2133. The power supply circuit 2133 includes a resistor 2133a for voltage division and a capacitor 2133b for removing the high-frequency component of a current supplied to the mixer 2033. A voltage divided by the power supply circuit 2133 is extracted as a signal MIX_Vmonitor, and inputted to the switch 213a in the voltage detection unit 213. The capacitor 2133b may be a plurality of capacitors having different capacitances. That is, the power supply circuit 2133 may be configured so that each capacitor removes a frequency component corresponding to the capacitance.

The voltage detection unit 213 is a circuit for detecting the voltage of the power supply circuit coupled to the active circuit of any of the tested units, and detects the voltages of the power supply circuits 2133, 2134 in this example. The voltage detection unit 213 has the switch 213a, an analog-to-digital converter 213b (hereinafter referred to as an ADC 213b), and a resistor 213c for voltage division. The switch 213a selects between the input of the signal PA_Vmonitor and the input of the signal MIX_Vmonitor, and outputs the selected signal to the ADC 213b. The ADC 213b converts the inputted voltage to a digital signal, which is outputted to the voltage current determination unit 130. The voltage current determination unit 130 is a circuit for detecting the failure of the active circuit (more specifically, the power supply circuit coupled to the active circuit) based on the voltage detected by the voltage detection unit 213. The voltage current determination unit 130 determines whether or not the inputted value is a normal value. More specifically, the voltage current determination unit 130 determines whether or not the inputted signal is within a predetermined range. Thereby, the voltage current determination unit 130 detects the abnormality of the power supply circuit 2134 of the power amplifier 2034 or the abnormality of the power supply circuit 2133 of the mixer 2033.

Figure 12:
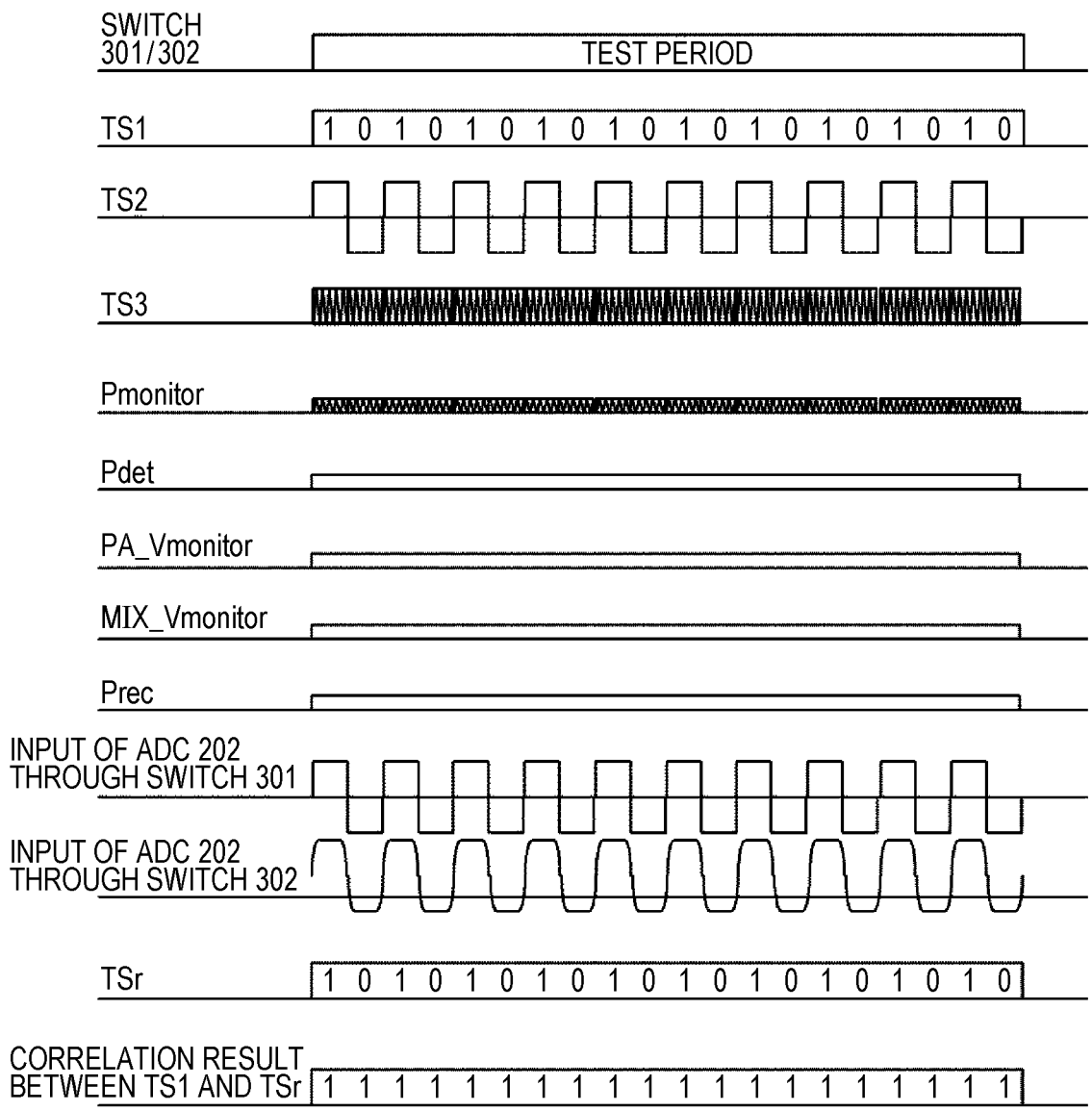
FIG. 12 is a time chart showing an example in which a power supply circuit 2134 and a power supply circuit 2133 are normal.

Next, failure detection by the wireless communication device 20 will be described with reference to time charts. The configuration of the wireless communication device 20 is the same as the configuration shown in FIG. 6, except for the configuration shown in FIG. 11. Although the following description will be made by way of example of BPSK modulation, the modulation method may be another arbitrary modulation method. The description will be made focusing particularly on the failure of the power supply circuit. First, a time chart in the case where the power supply circuit 2134 of the power amplifier 2034 and the power supply circuit 2133 of the mixer 2033 are normal will be described. FIG. 12 shows an example of a time chart showing a case where the power supply circuit 2134 and the power supply circuit 2133 are normal. FIG. 12 is the time chart in the case where not only the power supply circuits 2134 and 2133 but also all circuits on the transmission side and the reception side are normal. In the case where both the power supply circuits 2134 and 2133 are normal, the voltage current determination unit 130 determines that both the signal PA_Vmonitor and the signal MIX_Vmonitor are normal.

Figure 13:
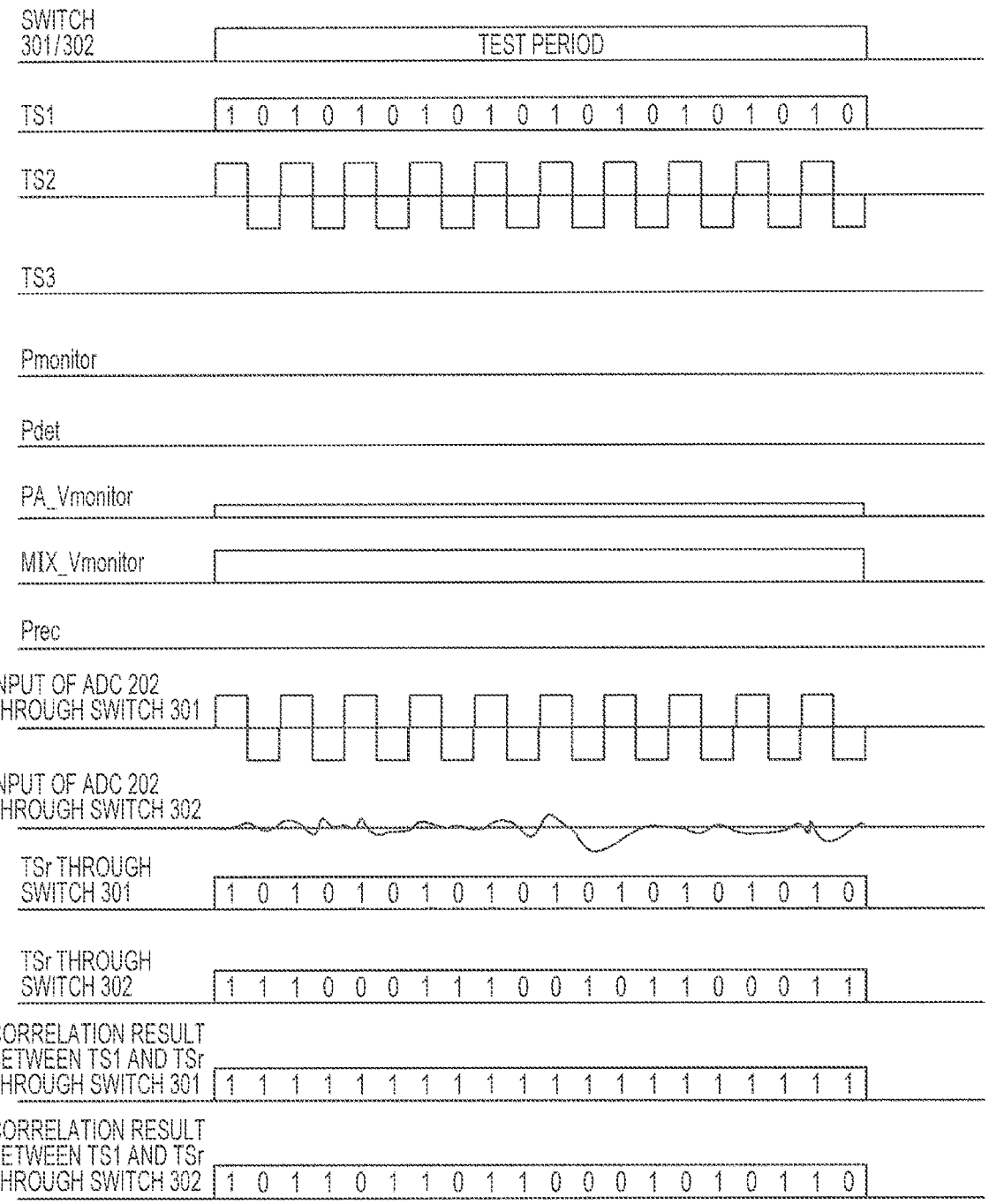
FIG. 13 is a time chart showing an example in which the power supply circuit 2133 of a mixer 2033 is abnormal.

Next, a time chart in the case where the power supply circuit 2133 of the mixer 2033 is abnormal will be described. FIG. 13 shows an example of a time chart showing a case where the power supply circuit 2133 of the mixer 2033 is abnormal. In the case where the power supply circuit 2133 of the mixer 2033 in the transmission side circuit is abnormal, the signal Pmonitor, the signal Pdet, and the signal MIX_Vmonitor obtained from the transmission side circuit become abnormal. Further, the signal Prec on the reception side also becomes abnormal. Further, the test signal TS3 outputted from the tested unit 203 on the transmission side becomes, for example, a no-signal state. The signal PA_Vmonitor is normal.

The test signal (test signal TS2) inputted to the ADC 202 through the path of the switch 301 is a normal signal, but the test signal (test signal TS4) inputted to the ADC 202 through the path of the switch 302 is a random noise signal. Therefore, while the correlation between the test signal TSr (test signal TSr1) through the switch 301 and the test signal TS1 is established, an error randomly occurs in the correlation result between the test signal TSr (test signal TSr2) through the switch 302 and the test signal TS1.

Therefore, from the determination result of each determination unit in the wireless communication device 20, it is possible to specify the failure part as follows. That is, since the reception data through the path of the switch 301 is normal and the signal Pdet is abnormal, it can be determined that the tested unit 203 in the transmission side circuit is in failure. Further, by using the determination result of the voltage current determination unit 130, it is possible to specify the failure part as follows. That is, since the signal PA_Vmonitor is normal and the signal MIX_Vmonitor is abnormal, it can be specified that the mixer 2033 (power supply circuit 2133) is in failure.

Next, failure detection in the case where the capacitor of the power supply circuit of the active circuit is in failure will be described. Although the description will be made by way of example of the failure of the capacitor 2134b shown in FIG. 11, the same applies to the failure of the capacitor 2133b or the capacitor of the power supply circuit of another active circuit.

Figure 14:
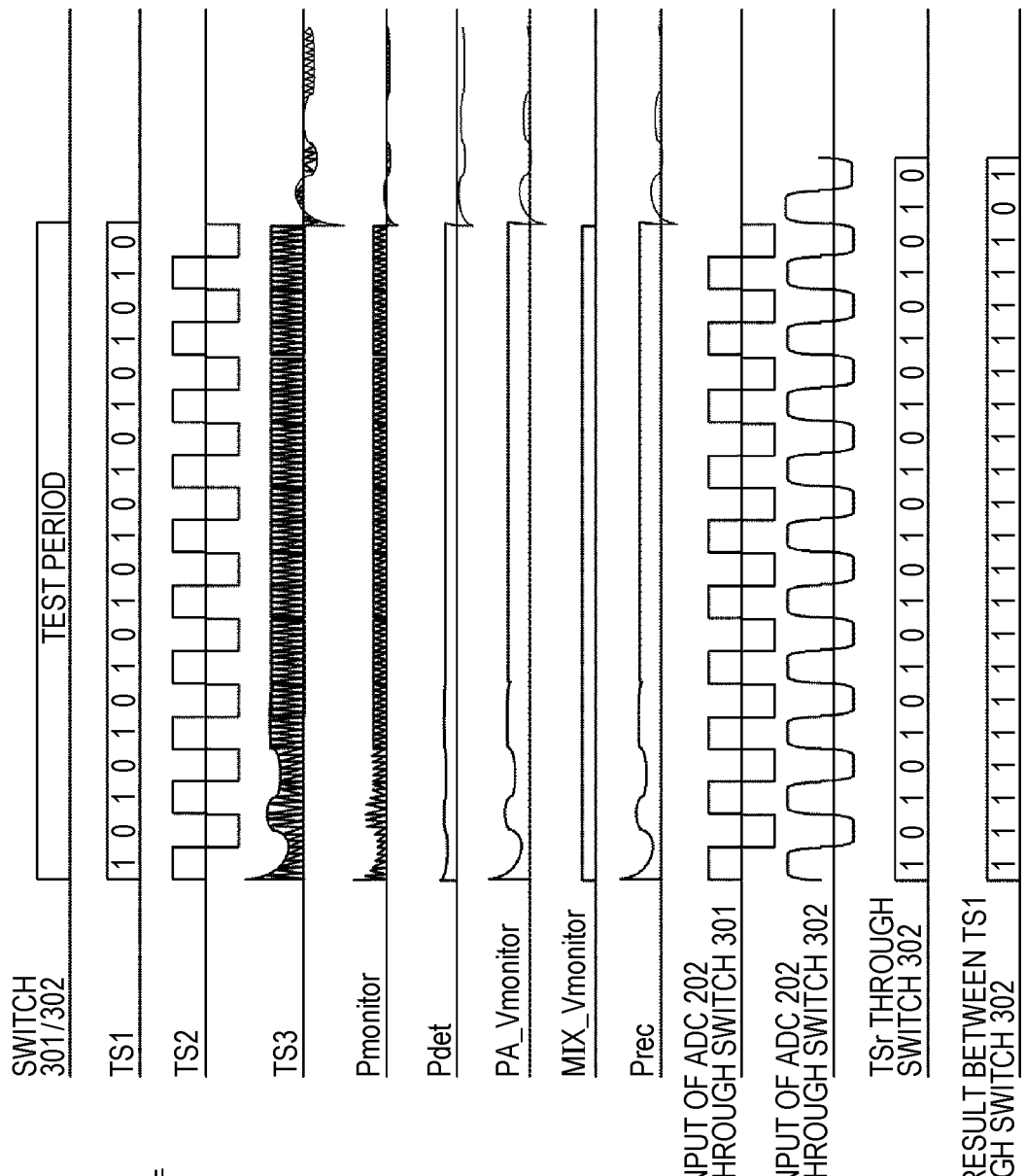
FIG. 14 is a time chart showing an example in which a capacitor 2134b coupled to the power supply circuit 2134 of a power amplifier 2034 is in failure.

FIG. 14 shows an example of a time chart showing a case where the capacitor 2134b coupled to the power supply circuit 2134 of the power amplifier 2034 is in failure. In this case, due to loss of the stability of the power supply circuit 2134 of the power amplifier 2034, by the influence of a transient response when the presence or absence of the signal inputted to the power amplifier 2034 changes, the voltage applied to the power amplifier 2034 fluctuates. Accordingly, the amplification factor of the power amplifier 2034 fluctuates. Accordingly, amplitude fluctuation occurs in the test signal TS3 immediately after the start and end of the test period. The fluctuation can be detected by the signal Pmonitor, the signal Pdet, and the signal PA_Vmonitor. In this case, due to no influence on the signal MIX_Vmonitor, it is determined that the signal MIX_Vmonitor is normal. Therefore, the voltage current determination unit 130 detects the fluctuation of the voltage (signal Pmonitor) detected by the voltage detection unit 213, and thereby can detect the failure of the capacitor 2134b coupled to the power supply circuit 2134 of the power amplifier 2034. The amplitude fluctuation can be also detected by the signal Prec in the reception side circuit. Since amplitude fluctuation remains in the test signal TS4 passed through the switch 302 after the test period, demodulation data appears in the test signal TSr in a time exceeding the test period.

Figure 15:
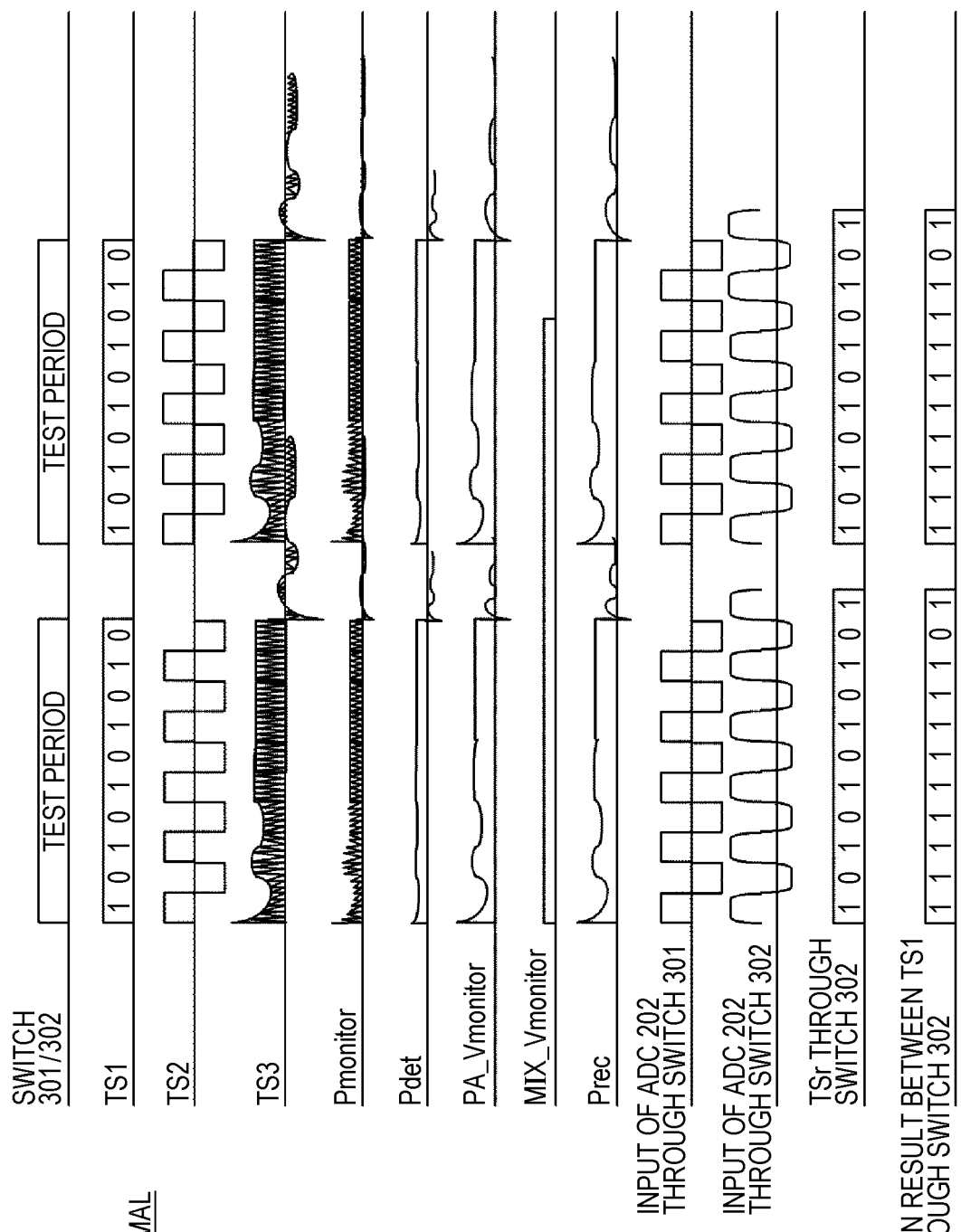
FIG. 15 is a time chart showing another example in which the capacitor 2134b coupled to the power supply circuit 2134 of the power amplifier 2034 is in failure.

As shown in FIG. 15, if the test period is shortened and the test interval is reduced, the signal after the end of the test period overlaps the next test period. An error occurs in the overlapping part of the received test signal due to inter-symbol interference. The test signal determination unit 120 can detect this error occurrence, and thereby detect the failure. That is, if there is an error in the first k bits (k is an integer equal to or greater than 1) of the test signal TSr, the test signal determination unit 120 may determine that an error occurs due to inter-symbol interference and may determine that the failure of the capacitor in the power supply circuit of any of the active circuits occurs.

A bit length where the inter-symbol interference occurs is related to the temporal length of the amplitude fluctuation of the test signal TS3 immediately after the end of the test period. That is, the magnitude of k corresponds to the time of the amplitude fluctuation of TS3. Further, the occurrence of the amplitude fluctuation of the test signal TS3 is caused by the failure of the capacitor, and the time of the amplitude fluctuation corresponds to the capacitance of the failed capacitor. Therefore, it is possible to estimate which capacitor is in failure, from the bit number where the inter-symbol interference occurs. Therefore, the test signal determination unit 120 may compare the bit length of the test signal TS1 generated by the test signal generation unit 100 with the bit length of the test signal TSr received by the test signal reception unit, and detect the failure of the capacitor corresponding to the magnitude (i.e., k) of the difference between both the bit lengths if the bit length of the received test signal TSr is longer than the bit length of the generated test signal TS1. Accordingly, for example, it is possible to specify which capacitor is in failure among a plurality of capacitors, having different capacitances, of the capacitor 2134b for removing a plurality of frequency components.

Thus, the second embodiment has been described with reference to the configuration of the actual circuit. While the above description has been made focusing on the power amplifier 2034 and the mixer 2033 as active circuits in the transmission side circuit, an active circuit in the reception side circuit can also have the same failure detection function. Further, while the description has been made by way of example of the failure of the mixer 2033 in FIG. 13, the same procedure can also apply to failure detection in the other active circuits. Further, while the description has been made by way of example of the failure of the capacitor 2134b of the power supply circuit 2134 of the power amplifier 2034 in FIGS. 14 and 15, the same failure detection can also apply to the other active circuits.

Third Embodiment

Figure 16:
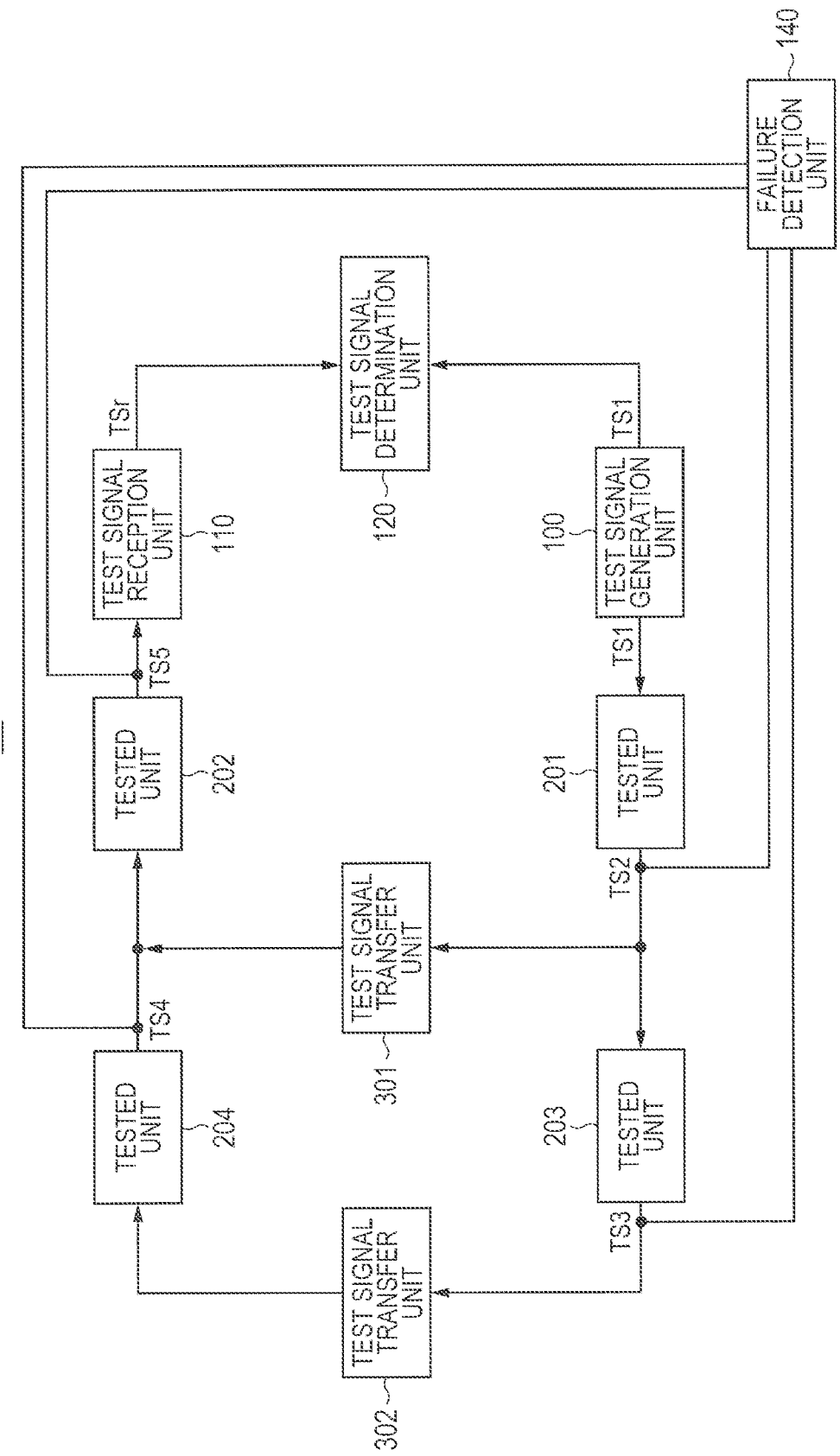
FIG. 16 is a block diagram showing the configuration of a wireless communication device according to a third embodiment.

The third embodiment differs from the first embodiment in that the failure of the tested units 201 to 204 is determined based on whether or not the output signal of each tested unit 201 to 204 satisfies a predetermined condition. FIG. 16 is a block diagram showing the configuration of a wireless communication device 30 according to the third embodiment. The wireless communication device 30 is the same as the wireless communication device 10 according to the first embodiment, except that a failure detection unit 140 is added.

The failure detection unit 140 acquires the respective output signals of the tested units 201 to 204, determines whether or not the respective output signals of the tested units 201 to 204 satisfy the respective predetermined conditions, and thereby detects the failure of the tested units 201 to 204. For example, the failure detection unit 140 monitors the output signal of the tested unit 203 when the test signal is transferred, and determines that a failure occurs in the tested unit 203 if the output signal does not satisfy the predetermined condition for the tested unit 203. Thus, the predetermined condition is set for each tested unit 201 to 204. More specifically, the predetermined condition is a condition satisfied by the signal outputted from the tested unit when the tested unit operates normally (that is, operates in the state of no occurrence of the failure).

More specifically, for example, in the case where the tested unit 203 is an amplifier, the failure detection unit 140 determines whether or not the tested unit 203 amplifies the test signal inputted to the tested unit 203 at a prescribed amplification factor. Thereby, the failure detection unit 140 detects the failure of the tested unit 203.

The failure detection unit 140 may directly acquire the respective output signals (test signals) from the tested units 201 to 204, or may acquire the signals from the test signal transfer units 301, 302 for transferring the test signal.

Further, in the configuration shown in FIG. 16, the failure detection unit 140 performs determination on all the tested units 201 to 204, but may perform determination on only some of them. Further, one failure detection unit 140 may be provided for each tested unit instead of being provided for a plurality of tested units as shown in this embodiment.

In the wireless communication device 30 according to the third embodiment, as described above, the failure detection unit 140 performs failure detection for each tested unit. Therefore, it is possible to detect the occurrence of the failure for each tested unit.

In this embodiment as well, the configuration including both the test signal determination unit 120 and the failure detection unit 140 can be replaced with a configuration including only the failure detection unit 140. This embodiment may be combined with any of the later-described embodiments. That is, the failure detection unit 140 may perform failure detection on any of the tested units shown in the later-described embodiments.

Fourth Embodiment

Figure 17:
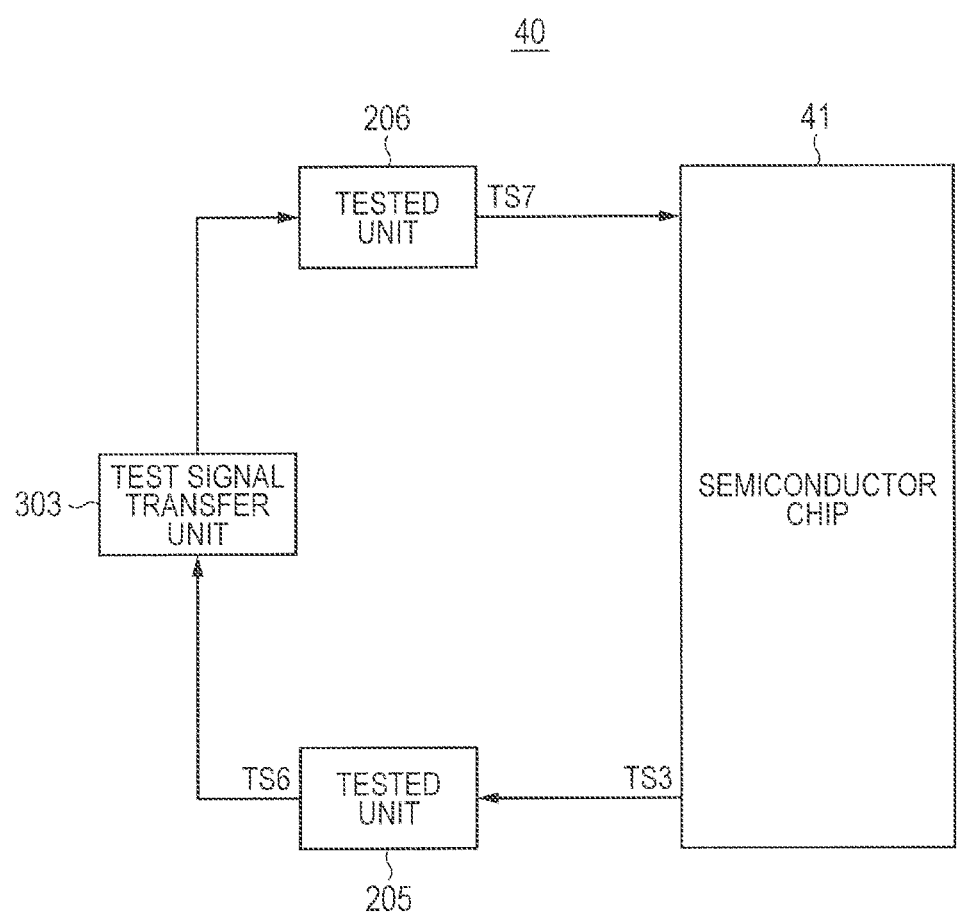
FIG. 17 is a block diagram showing the configuration of a wireless communication device according to a fourth embodiment.

Each constituent element shown in FIG. 1 may be implemented in a semiconductor chip. In this case, according to the first embodiment, the wireless communication device 10 for detecting the failure inside the semiconductor chip is provided. On the other hand, the fourth embodiment shows a configuration for detecting the failure of a component mounted outside the semiconductor chip. FIG. 17 is a block diagram showing the configuration of a wireless communication device 40 according to the fourth embodiment. The wireless communication device 40 has a semiconductor chip 41, a tested unit 205, a tested unit 206, and a test signal transfer unit 303.

The semiconductor chip 41 includes at least the tested units 201 to 204 and the test signal transfer units 301 to 302. This embodiment will be described assuming that the semiconductor chip 41 includes all configurations shown in FIG. 1.

The tested unit 205 is a circuit electrically coupled to the semiconductor chip 41 and belonging to the transmission side circuit. More specifically, the tested unit 205 is a circuit component coupled to the tested unit 203 shown in FIG. 1. The tested unit 205 is an arbitrary circuit used to transmit the wireless signal, such as a transmission amplifier for amplifying the transmission signal.

The tested unit 206 is a circuit electrically coupled to the semiconductor chip 41 and belonging to the reception side circuit. More specifically, the tested unit 206 is a circuit component coupled to the tested unit 204 shown in FIG. 1. The tested unit 206 is an arbitrary circuit used to receive the wireless signal, such as a reception amplifier for amplifying the reception signal. The tested units 205, 206 may be mere signal lines.

The test signal transfer unit 303 is a circuit for transferring the test signal from the transmission side circuit to the reception side circuit, like the test signal transfer units 301, 302. Further, the test signal transfer unit 303 can switch whether or not to transfer the test signal from the transmission side circuit to the reception side circuit, like the test signal transfer units 301, 302. The test signal transfer unit 303 is, for example, a transfer circuit including a switch, a coupler, or a variable attenuator.

The test signal TS3 outputted by the tested unit 203 of the semiconductor chip 41 is inputted to the tested unit 205. The tested unit 205, for example, amplifies the test signal TS3, and outputs the amplified signal. A test signal TS6 outputted by the tested unit 205 is inputted through the test signal transfer unit 303 to the tested unit 206. That is, the test signal transfer unit 303 performs feedback so as to input the test signal TS6 outputted from the tested unit 205 to the tested unit 206. Therefore, a test signal TS7 outputted from the tested unit 206 or the test signal TS3 through the test signal transfer unit 302 is inputted to the tested unit 204 of the semiconductor chip 41.

Therefore, in this embodiment, the test signal TS4 outputted by the tested unit 204 through the tested unit 206, the test signal TS4 outputted by the tested unit 204 through the test signal transfer unit 302, or the test signal TS2 through the test signal transfer unit 301 is inputted to the tested unit 202. Then, the tested unit 202 performs analog-to-digital conversion on each signal, and outputs the converted signal to the test signal reception unit 110. The test signal reception unit 110 outputs the test signal TSr to the test signal determination unit 120. Thereby, the test signal determination unit 120 performs determination.

In this embodiment, the test signal determination unit 120 determines the test signal TSr1, the test signal TSr2, and the test signal TSr fed back through the test signal transfer unit 303. Hereinafter, the test signal TSr fed back through the test signal transfer unit 303 is referred to as a test signal TSr3.

For example, if a failure occurs only in the tested unit 201 or 202, it is determined that all the test signals TSr1, TSr2, and TSr3 are abnormal. For example, if a failure occurs only in the tested unit 203 or 204, it is determined that the test signal TSr1 is normal and the test signals TSr2 and TSr3 are abnormal. For example, if a failure occurs only in the tested unit 205 or 206, it is determined that the test signals TSr1 and TSr2 are normal and the test signal TSr3 is abnormal.

That is, according to the wireless communication device 40 according to this embodiment, if it is determined that all the test signals TSr1 to TSr3 are abnormal, it can be specified that the tested unit 201 or 202 is a failure part. In other words, in this case, it can be judged that the tested units 203 to 206 are circuits where the failure does not occur and the tested unit 201 or 202 is a circuit where the failure might occur.

If it is determined that the test signal TSr1 is normal and the test signals TSr2 and TSr3 are abnormal, it can be specified that the tested unit 203 or 204 is a failure part. In other words, in this case, it can be judged that the tested units 201, 202, 205, and 206 are circuits where the failure does not occur and the tested unit 203 or 204 is a circuit where the failure might occur.

If it is determined that the test signals TSr1 and TSr2 are normal and the test signal TSr3 is abnormal, it can be specified that the tested unit 205 or 206 is a failure part. In other words, in this case, it can be judged that the tested units 201 to 204 are circuits where the failure does not occur and the tested unit 205 or 206 is a circuit where the failure might occur.

In this embodiment as well, the failure part may be specified by the test signal determination unit 120 or by another determination unit (not shown) that receives the determination result of the test signal determination unit 120.

Thus, the fourth embodiment has been described. The wireless communication device 40 according to the fourth embodiment further has the loopback circuit through the circuits outside the semiconductor chip 41 (the loopback circuit through the test signal transfer unit 303). Therefore, according to the wireless communication device 40, it is possible to discriminate between the circuit where the failure does not occur and the circuit where the failure might occur, including the circuits not only inside but also outside the semiconductor chip 41.

Fifth Embodiment

Figure 18:
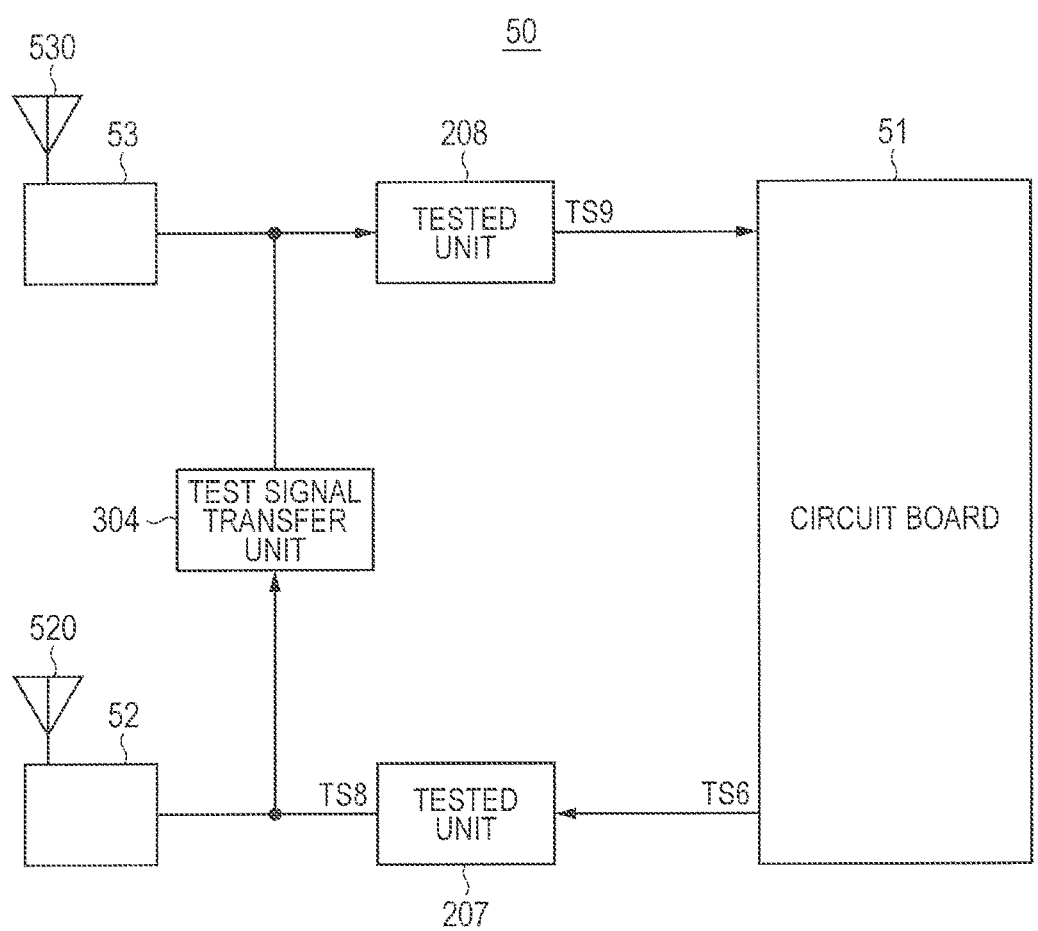
FIG. 18 is a block diagram showing the configuration of a wireless communication device according to a fifth embodiment.

Each constituent element shown in FIG. 17 may be implemented on one circuit board. In this case, according to the fourth embodiment, the wireless communication device 40 for detecting the failure of each constituent element implemented on the same circuit board is provided. On the other hand, the fifth embodiment shows a configuration for detecting the failure of a wireless communication device including antennas provided on other circuit boards. FIG. 18 is a block diagram showing the configuration of a wireless communication device 50 according to the fifth embodiment. The wireless communication device 50 has a circuit board 51, a tested unit 207, a tested unit 208, a test signal transfer unit 304, circuit boards 52, 53, and antennas 520, 530. In this embodiment, the wireless communication device 50 is mounted in a vehicle such as an automobile. That is, the circuit boards 51 to 53 are mounted in the vehicle. Therefore, in this embodiment, it is possible to detect the failure of the wireless communication device 50 mounted in the vehicle. However, the invention is not limited thereto, the wireless communication device 50 may be mounted in equipment other than the vehicle.

The circuit board 51 is a board where all constituent elements shown in FIG. 17 are implemented. That is, the circuit board 51 includes the semiconductor chip 41, the tested unit 205, the tested unit 206, and the test signal transfer unit 303.

The tested unit 207 is a circuit electrically coupled to the circuit board 51 and belonging to the transmission side circuit. More specifically, the tested unit 207 is a circuit component coupled to the tested unit 205 shown in FIG. 17. In this embodiment, the tested unit 207 is a cable for coupling the circuit board 51 and the circuit board 52 and transferring the signal, but may be an arbitrary circuit used to transmit the wireless signal.

The tested unit 208 is a circuit electrically coupled to the circuit board 51 and belonging to the reception side circuit. More specifically, the tested unit 208 is a circuit component coupled to the tested unit 206 shown in FIG. 17. In this embodiment, the tested unit 208 is a cable for coupling the circuit board 51 and the circuit board 53 and transferring the signal, but may be an arbitrary circuit used to receive the wireless signal.

The test signal transfer unit 304 is a circuit for transferring the test signal from the transmission side circuit to the reception side circuit, like the test signal transfer units 301, 302, 303. Further, the test signal transfer unit 304 can switch whether or not to transfer the test signal from the transmission side circuit to the reception side circuit, like the test signal transfer units 301, 302, 303. The test signal transfer unit 304 is, for example, a transfer circuit including a switch, a coupler, or a variable attenuator.

The circuit board 52 is a board different from the circuit board 51 and provided with the antenna 520. For example, a circuit for controlling the antenna 520 is implemented on the circuit board 52. The antenna 520 is an antenna for transmitting the signal generated in the circuit board 51. That is, the antenna 520 belongs to the transmission side circuit. The antenna 520 may also be referred to as a transmission antenna.

The circuit board 53 is a board different from the circuit board 51 and provided with the antenna 530. For example, a circuit for controlling the antenna 530 is implemented on the circuit board 53. The antenna 530 is an antenna for receiving a signal transmitted from another antenna and outputting the signal to the circuit board 51. That is, the antenna 530 belongs to the reception side circuit. The antenna 530 can receive the signal transmitted from the antenna 520. Therefore, the antenna 530 can receive, for example, the test signal emitted from the antenna 520 into the air. The antenna 530 is also referred to as a reception antenna.

The test signal TS6 outputted by the tested unit 205 of the circuit board 51 is inputted to the tested unit 207. The tested unit 207 transfers the signal outputted from the circuit board 51 to the circuit board 52. A test signal TS8 through the test signal transfer unit 304 or the test signal TS8 transmitted from the antenna 520 and received by the antenna 530 is inputted to the tested unit 208. The test signal TS8 is a test signal outputted by the tested unit 207. The test signal transfer unit 304 performs feedback so as to branch the test signal TS8 inputted from the tested unit 207 to the antenna 520 and input the test signal TS8 to the tested unit 208. Therefore, a test signal TS9 outputted from the tested unit 208 or the test signal TS6 through the test signal transfer unit 303 is inputted to the tested unit 206 of the circuit board 51.

Therefore, in this embodiment, the test signal through the test signal transfer unit 302, 303, or 304 or the antennas 520, 530 is inputted to the tested unit 204 of the circuit board 51. Accordingly, the test signal through the test signal transfer unit 301, 302, 303, or 304 or the antennas 520, 530 is inputted to the tested unit 202. Then, the tested unit 202 performs analog-to-digital conversion on each signal, and outputs the converted signal to the test signal reception unit 110. The test signal reception unit 110 outputs the test signal TSr to the test signal determination unit 120. Thereby, the test signal determination unit 120 performs determination.

In this embodiment, the test signal determination unit 120 determines the test signal TSr1, the test signal TSr2, the test signal TSr3, the test signal TSr fed back through the test signal transfer unit 304, and the test signal TSr fed back through the antennas 520, 530. Hereinafter, the test signal TSr fed back through the test signal transfer unit 304 is referred to as a test signal TSr4, and the test signal TSr fed back through the antennas 520, 530 is referred to as a test signal TSra.

For example, if a failure occurs only in the tested unit 201 or 202, it is determined that all the test signals TSr1, TSr2, TSr3, TSr4, and TSra are abnormal. For example, if a failure occurs only in the tested unit 203 or 204, it is determined that the test signal TSr1 is normal and the test signals TSr2, TSr3, TSr4, and TSra are abnormal. For example, if a failure occurs only in the tested unit 205 or 206, it is determined that the test signals TSr1 and TSr2 are normal and the test signals TSr3, TSr4, and TSra are abnormal. For example, if a failure occurs only in the tested unit 207 or 208, it is determined that the test signals TSr1, TSr2, and TSr3 are normal and the test signals TSr4 and TSra are abnormal. For example, if a failure occurs only in the antenna 520 or 530, it is determined that the test signals TSr1, TSr2, TSr3, and TSr4 are normal and the test signal TSra is abnormal.

That is, according to the wireless communication device 50 according to this embodiment, if it is determined that all the test signals TSr1 to TSr4 and TSra are abnormal, it can be specified that the tested unit 201 or 202 is a failure part. In other words, in this case, it can be judged that the tested units 203 to 208 and the antennas 520, 530 are circuits where the failure does not occur and the tested unit 201 or 202 is a circuit where the failure might occur.

If it is determined that the test signal TSr1 is normal and the test signals TSr2, TSr3, TSr4, and TSra are abnormal, it can be specified that the tested unit 203 or 204 is a failure part. In other words, in this case, it can be judged that the tested units 201, 202, 205 to 208, and the antennas 520, 530 are circuits where the failure does not occur and the tested unit 203 or 204 is a circuit where the failure might occur.

If it is determined that the test signals TSr1 and TSr2 are normal and the test signals TSr3, TSr4, and TSra are abnormal, it can be specified that the tested unit 205 or 206 is a failure part. In other words, in this case, it can be judged that the tested units 201 to 204, 207, 208, and the antennas 520, 530 are circuits where the failure does not occur and the tested unit 205 or 206 is a circuit where the failure might occur.

If it is determined that the test signals TSr1, TSr2, and TSr3 are normal and the test signals TSr4 and TSra are abnormal, it can be specified that the tested unit 207 or 208 is a failure part. In other words, in this case, it can be judged that the tested units 201 to 206 and the antennas 520, 530 are circuits where the failure does not occur and the tested unit 207 or 208 is a circuit where the failure might occur.

If it is determined that the test signals TSr1, TSr2, TSr3, and TSr4 are normal and the test signal TSra is abnormal, it can be specified that the antenna 520 or 530 is a failure part. In other words, in this case, it can be judged that the tested units 201 to 208 are circuits where the failure does not occur and the antenna 520 or 530 is a circuit where the failure might occur.

In this embodiment as well, the failure part may be specified by the test signal determination unit 120 or by another determination unit (not shown) that receives the determination result of the test signal determination unit 120.

Thus, the fifth embodiment has been described. The wireless communication device 50 according to the fifth embodiment further has the loopback circuits through the circuits outside the circuit board 51 (the loopback circuit through the test signal transfer unit 304 and the loopback circuit through the antennas 520, 530). Therefore, according to the wireless communication device 50, it is possible to discriminate between the circuit where the failure does not occur and the circuit where the failure might occur, including the circuits not only inside but also outside the circuit board 51. In the case where the wireless communication device 50 is mounted in the vehicle, in the cables (i.e., the tested units 207 and 208) for joining the circuit board 51 and the circuit boards 52, 53, physical abnormality such as looseness might occur at a joint part with the board, due to the influence of vibration or the like associated with the travel of the vehicle. According to this embodiment, if such abnormality occurs, it is possible to detect the failure and specify that the cable part is an abnormal part.

Figure 19:
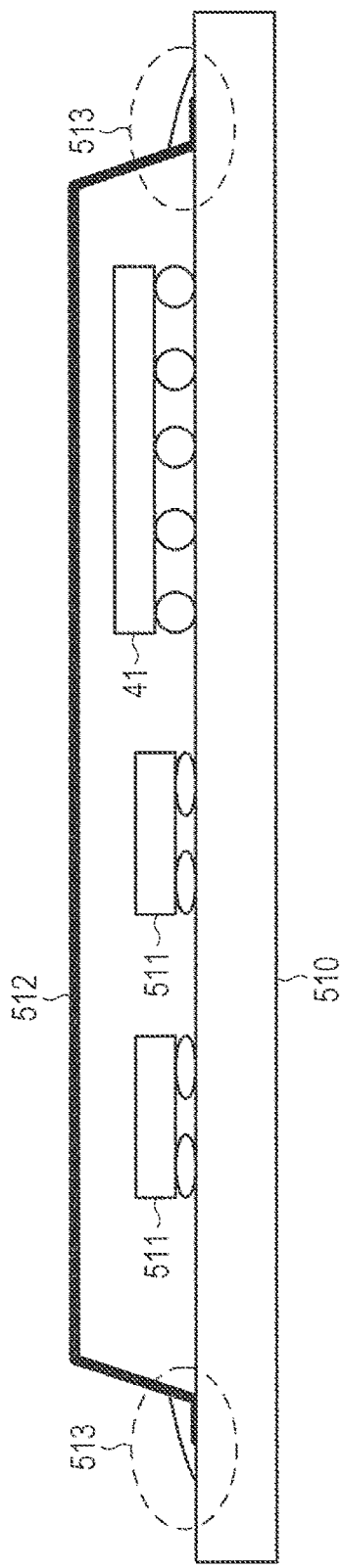
FIG. 19 is a diagram schematically showing the section of a circuit board provided with a shield.

In the case where the circuit board is provided with a shield (shield case), it is also possible to detect the abnormality of the shield. FIG. 19 is a diagram schematically showing the section of the circuit board 51 provided with a shield. In the circuit board 51, the semiconductor chip 41 and a component 511 are implemented on a board 510. The component 511 may be the tested unit 205, the tested unit 206, or the test signal transfer unit 303, shown in FIG. 17, or may be another circuit component. Further, the circuit board 51 is provided with a shield 512.

The shield 512 is a shield case for covering the semiconductor chip 41 and the component 511. The end of the shield 512 is soldered to the ground electrode of the board 510 at a shield attaching portion 513. The role of the shield 512 is not only to prevent the destruction of a circuit caused by external physical shock or the like but also to prevent the radiation of a signal from a circuit on the board 510 or to confine the signal within the shield 512. However, removal in the attachment at the shield attaching portion 513 causes the signal to be radiated from the opening of the removed portion. Further the removal in the attachment changes the shape of a closed space formed by the shield 512 and the board 510, and changes the resonance frequency of a cavity within the shield 512. This increase signal radiation from the circuit. Accordingly, the radiated signal propagates to another wire line through the cavity, which consequently increases an unwanted signal component on the wire line, and degrades communication characteristics. Such an unwanted signal component is superimposed, for example, on the test signal TS7 outputted from the tested unit 206.

FIG. 20 is a graph showing an example of frequency components changed due to removal in the attachment of the shield 512. In the graph, a solid arrow indicates the signal component of the test signal on the reception side when the shield 512 is normal, and a dashed arrow indicates a signal component (spurious component) increased in occurrence of abnormality in the shield 512 (removal in the attachment).

The test signal determination unit 120 may detect a spurious component included in the test signal TSr received by the test signal reception unit and thereby detect the abnormality of the shield 512. The spurious component is detected, for example, by comparing the prestored signal power of a prescribed frequency when the shield 512 is normal with the signal power of the frequency of the received test signal TSr.

In the case of removal in the attachment of any of a plurality of attaching portions 513 of the shield 512, the shield 512 opens at the removed portion. This changes the size of the cavity formed by the shield 512. The frequency of a generated spurious component varies according to the size of the cavity. Therefore, by specifying which of the frequencies the spurious component occurs at, it is possible to acquire the characteristic of the current cavity formed by the shield 512 (more specifically, the characteristic of the size of the current cavity). Specifying the size of the current cavity means being able to specify the portion of removal in the attachment. Therefore, it is preferable to find the presence or absence of the occurrence of the spurious component at various frequencies. That is, the test signal determination unit 120 may detect the spurious component included in the test signal TSr received by the test signal reception unit at each frequency and thereby specify the portion of removal in the attachment of the shield 512 to the board 510.

Hereinafter, an example of a method for finding the presence or absence of the occurrence of the spurious component at various frequencies will be specifically described. FIGS. 21 and 22 are schematic diagrams showing the relationship between the time-base waveform and frequency component of the test signal. In FIG. 21, the upper diagram shows the time-base waveform when the transmission side circuit outputs the test signal having a frame length $t_1$ with a period $t_1$ (i.e., a transmission interval $t_1$ of the test signal), and the lower diagram shows an example of the frequency component of the test signal TSr received when such a signal is outputted. Similarly, in FIG. 22, the upper diagram shows the time-base waveform when the transmission side circuit outputs the test signal having a frame length $t_2$ with a period $t_2$ (i.e., a transmission interval $t_2$ of the test signal), and the lower diagram shows an example of the frequency component of the test signal TSr received when such a signal is outputted. Assume that $t_2$ is larger than $t_1$.

As shown in FIG. 21, assuming that $t_1$ denotes the frame length and period of the test signal, the test signal TSr includes not only a signal having a carrier frequency $f_0$ but also a frequency component obtained by multiplying $t_1$ by a coefficient α for example. Therefore, in occurrence of abnormality in the shield 512, it is detected that a spurious component is superimposed on the signal component of a frequency represented by $f_0-1/\alpha t_1$ for example. Similarly, as shown in FIG. 22, assuming that $t_2$ denotes the frame length and period of the test signal, the test signal TSr includes not only the signal having the carrier frequency $f_0$ but also a frequency component obtained by multiplying $t_2$ by the coefficient α for example. Therefore, in occurrence of abnormality in the shield 512, it is detected that a spurious component is superimposed on the signal component of a frequency represented by $f_0-1/\alpha t_2$ for example. Therefore, by changing the frame length and period of the test signal, it is possible to find the presence or absence of the occurrence of the spurious component at various frequencies. Therefore, for example, the test signal generation unit 100 changes the frame length and period of the test signal and outputs the test signal.

Thus, the circuit board 51 provided with the shield 512 has been described. According to the above configuration, it is possible to detect the abnormality of the shield 512 by detecting the spurious component included in the test signal. It is desirable that the normal size of the shield 512 is designed to be a size according to the cutoff frequency of a frequency component requiring suppression. That is, for example, it is desirable but not necessary that the width (and depth) of the shield 512 is designed to be less than half the wavelength of the signal to be suppressed.

Sixth Embodiment

Figure 23:
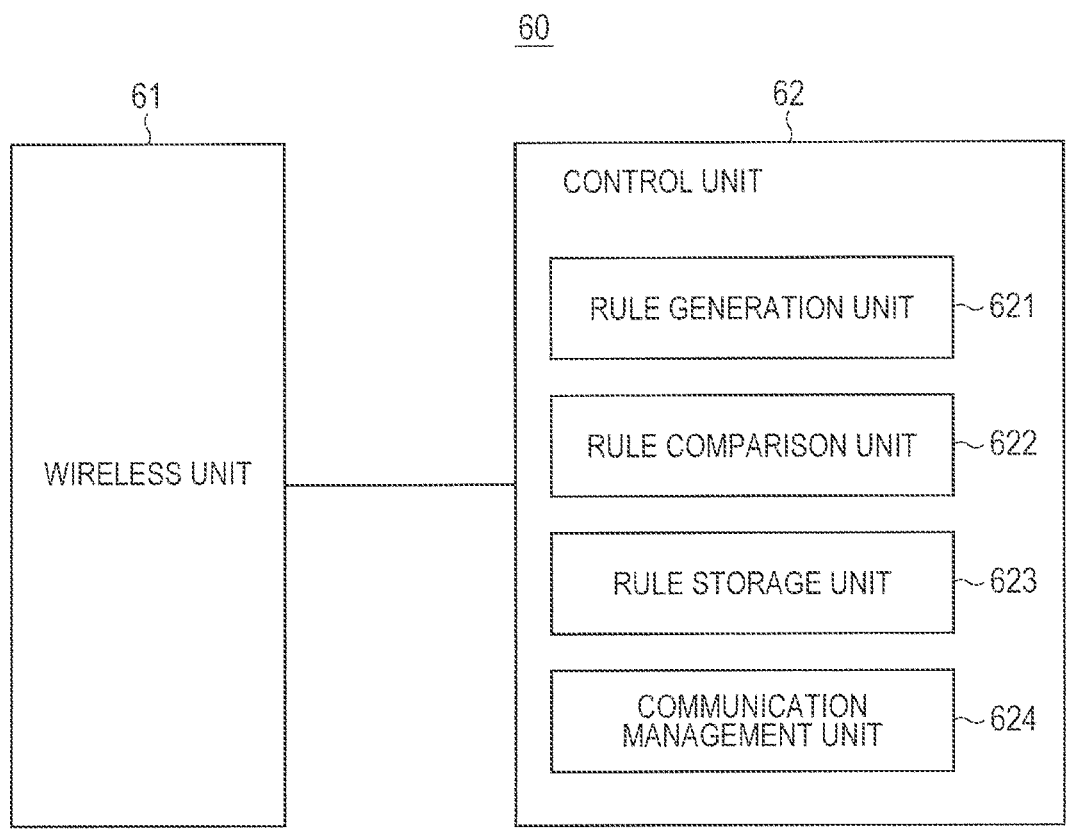
FIG. 23 is a block diagram showing the configuration of a wireless communication device according to a sixth embodiment.

FIG. 23 is a block diagram showing the configuration of a wireless communication device 60 according to a sixth embodiment. The wireless communication device 60 has a wireless unit 61 and a control unit 62. The wireless unit 61 may be any of the wireless communication devices 10 to 50. That is, the wireless unit 61 includes the test signal generation unit 100, the test signal reception unit 110, the test signal determination unit 120, and a plurality of loopback circuits.

The control unit 62 has a rule generation unit 621, a rule comparison unit 622, a rule storage unit 623, and a communication management unit 624. The rule generation unit 621 is also referred to as a rule notification unit, and the rule comparison unit 622 is also referred to as a rule determination unit.

The control unit 62 is, for example, an MCU (Micro Controller Unit), and has a processor such as a CPU (Central Processing Unit) and a memory such as a RAM (Random Access Memory) and a ROM (Read Only Memory). The rule generation unit 621, the rule comparison unit 622, and the communication management unit 624 are implemented, for example, when the processor of the control unit 62 executes a program stored in the memory. The rule storage unit 623 is implemented, for example, by the memory of the control unit 62.

The program can be stored using various types of non-transitory computer readable media and supplied to a computer. The non-transitory computer readable media include various types of tangible storage media, such as a magnetic recording medium (e.g., flexible disk, magnetic tape, hard disk drive), a magneto-optical recording medium (e.g., magneto-optical disk), a CD-ROM (Read Only Memory), a CD-R, a CD-R/W, and a semiconductor memory (e.g., mask ROM, PROM (Programmable ROM), EPROM (Erasable PROM), flash ROM, RAM (Random Access Memory)). Further, the program may be supplied to the computer via various types of transitory computer readable media. The transitory computer readable media include, for example, an electric signal, an optical signal, and an electromagnetic wave. The transitory computer readable media can supply the program to the computer through a wire communication path such as an electric wire and an optical fiber or a wireless communication path.

The rule generation unit 621 generates the generation rule of the test signal. The generation rule is a control signal for stipulating what test signal is to be generated. For example, the generation rule stipulates the signal length of the test signal, the transmission time interval (generation time interval) of the test signal, or the transmission timing (generation timing) of the test signal. The rule generation unit 621 notifies the generation rule of the test signal to the test signal generation unit 100 of the wireless unit 61. To detect various failures, the rule generation unit 621 can generate various generation rules.

For example, the power supply circuit of the tested unit is provided with a large-time-constant component (large-constant resistor or capacitor) for suppressing power supply fluctuation caused by the presence or absence of the signal. Accordingly, by transmitting and receiving the test signal having a long signal length and measuring the convergence situation, the failure of the tested unit caused by the failure of such a component is detected. That is, in this case, the rule generation unit 621 stipulates the generation rule so as to generate the test signal having a signal length larger than a predetermined first threshold for example. The convergence situation is measured, for example, by the rule comparison unit 622 based on the test signal TSr outputted by the test signal reception unit 110 of the wireless unit 61, but may be measured by any of the constituent elements in the wireless unit 61 such as the test signal determination unit 120.

On the other hand, a component (resistor or capacitor) inserted in the signal line of the tested unit has a small time constant to transfer high-frequency signals. Accordingly, by transmitting and receiving the test signal having a short signal length and measuring the signal power, the failure of the tested unit caused by the failure of such a component is detected. That is, in this case, the rule generation unit 621 stipulates the generation rule so as to generate the test signal having a signal length less than a predetermined second threshold for example. The signal power is measured, for example, by the test signal determination unit 120 of the wireless unit 61, but may be measured by the rule comparison unit 622 based on the test signal TSr outputted by the test signal reception unit 110.

In the measurement of the convergence situation, to measure ringing after the test signal ends, it is preferable that a no-signal time of the transmission time interval is long. Therefore, the rule generation unit 621 stipulates the transmission time interval by the generation rule so that the no-signal time is larger than a predetermined third threshold for example. In other words, the rule generation unit 621 stipulates the transmission time interval larger than the predetermined third threshold by the generation rule.

On the other hand, in the measurement of the signal power, since not only the presence or absence of the signal but also the average power is measured, it is preferable that the no-signal time is short. Therefore, the rule generation unit 621 stipulates the transmission time interval by the generation rule so that the no-signal time is less than a predetermined fourth threshold for example. In other words, the rule generation unit 621 stipulates the transmission time interval less than the predetermined fourth threshold by the generation rule.

Further, for example, in the case where a non-modulation signal (e.g., sine wave) is used as the test signal, or a data signal string with repetition of 0 and 1 is used as the test signal, the failure of an analog circuit such as the amplifier and the mixer can be detected by measuring the output power of the analog circuit. However, since such a test signal is not a burst signal, it is not possible to detect a failure in which the transient response of the circuit changes, such as the failure of the power supply circuit of the analog component. Accordingly, to detect such a failure, it is preferable to set the transmission time interval so as to have the no-signal time. Therefore, to detect such a failure, the rule generation unit 621 stipulates the transmission time interval having the no-signal time by the generation rule.

To transmit the test signal at the transmission time interval having the no-signal time, data according to a prescribed communication frame and a prescribed packet format may be used as the test signal. Further, pseudorandom code may be used to satisfy constraints of the packet format.

To perform the failure detection test using the test dedicated signal when the wireless communication device 60 is actually operated, it is necessary to perform the failure detection test during a time when communication with another wireless communication device is not performed. That is, the transmission timing (generation timing) of the test signal needs to be included in a time zone when communication with another wireless communication device is not performed. In this embodiment, the rule generation unit 621 stipulates the generation timing so as to generate the test signal during the time zone when communication with another wireless communication device is not performed, based on information from the communication management unit 624 for managing communication between the wireless communication device 60 and another wireless communication device. Therefore, it is possible to execute the failure detection test without disturbing communication with another wireless communication device. The time when communication with another wireless communication device is not performed may be, for example, a time when vehicle-to-vehicle communication between the vehicle equipped with the wireless communication device 60 and another vehicle is not performed, or may be a time between intermittent vehicle-to-vehicle communications.

The rule generation unit 621 generates the generation rule according to the type of failure to be detected, notifies the generated generation rule to the test signal generation unit 100, and stores it in the rule storage unit 623. The test signal generation unit 100 of the wireless unit 61 generates the test signal in accordance with the generation rule notified from the rule generation unit 621. The rule storage unit 623 stores the generation rule generated by the rule generation unit 621. The rule storage unit 623 may store a predetermined packet error rate of the test signal received by the test signal reception unit 110. The predetermined packet error rate is a packet error rate assumed in the case of no occurrence of the failure.

When the test signal generation unit 100 of the wireless unit 61 generates the test signal in accordance with the generation rule, the test signal is inputted to the test signal reception unit 110 through the test signal transfer unit 301, 302, 303, or 304 or the antennas 520, 530.

When the test signal reception unit 110 receives the test signal, the rule comparison unit 622 of the control unit 62 determines whether or not the test signal received by the test signal reception unit 110 is the signal corresponding to the generated generation rule. The rule comparison unit 622 compares the generation rule specified from the reception result of the test signal reception unit 110 with the generation rule stored in the rule storage unit 623, and determines whether or not the two generation rules match each other. If the two generation rules do not match, the rule comparison unit 622 determines that the failure according to the content of the generation rule occurs.

For example, if the power supply circuit of the tested unit is in failure, despite transmission of the test signal having a signal length of 1 seconds for example, the test signal having a signal length of 1.1 seconds is received by the test signal reception unit 110. Accordingly, the rule comparison unit 622 detects the difference between the generation rule used to generate the test signal and the generation rule specified from the received test signal (in this case, the difference between the signal lengths), and thereby the wireless communication device 60 detects the failure caused by the power supply circuit.

For example, if there is a failure in the wireless unit 61, a phenomenon in which an error is included in at least a part of the packet of the received test signal, or a phenomenon in which a part of the transmitted test signal cannot be received can occur. The rule comparison unit 622 may detect such a phenomenon and thereby detect the failure, by comparing the generation rule specified from the reception result of the test signal reception unit 110 with the generation rule stored in the rule storage unit 623, and determining whether or not the two generation rules match each other. It is needless to say that the signal power strength of the transmission signal may be set to be lower than normal or a reception power gain may be set to be lower than normal to facilitate the occurrence of a reception error.

The rule comparison unit 622 may detect the occurrence of the failure by comparing the packet error rate of the test signal received by the test signal reception unit 110 with the assumed packet error rate stored in the rule storage unit 623.

Thus, the sixth embodiment has been described. In this embodiment, the test signal generation unit 100 generates the test signal in accordance with the generation rule of the test signal generated by the rule generation unit 621. Therefore, it is possible to generate the test signal according to the occurrence factor of the failure. Therefore, according to this embodiment, the wireless communication device 60 can detect an arbitrary failure. The rule comparison unit 622 determines whether or not the test signal received by the test signal reception unit 110 is the signal corresponding to the generation rule generated by the rule generation unit 621. Therefore, according to this embodiment, it is possible to detect the failure causing the generation rule specified from the received test signal to change from the generation rule used to generate the test signal.

Figure 24:
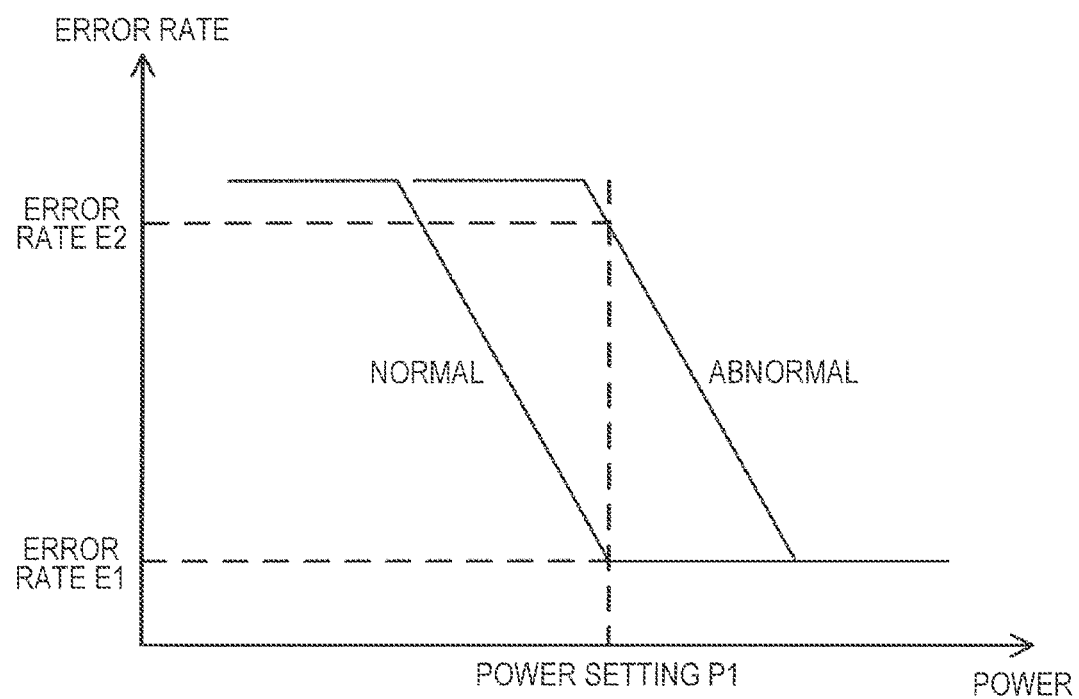
FIG. 24 is a graph showing an example of the relationship between the setting of a VGA of a reception side circuit and a packet error rate.

The above description has been made on the procedure in which the rule comparison unit 622 compares the packet error rate of the received test signal with the prescribed packet error rate and thereby detects the failure. The failure detection by the packet error rate will be supplementarily described. FIG. 24 is a graph showing an example of the relationship between the setting of the VGA 2044 of the reception side circuit and the packet error rate. As shown in FIG. 24, generally, the packet error rate is high if a power inputted to the ADC 202 is too small, gradually decreases as the power increases from a certain value, and becomes a lower limit error rate when a power larger than a prescribed value is inputted to the ADC 202.

For example, if both the transmission side circuit and the reception side circuit are normal, the packet error rate in the case where the power setting of the VGA 2044 is a power setting P1 is an error rate E1. On the other hand, if there is a failure in any of the circuits; even if the power setting of the VGA 2044 is the power setting P1, since a power value inputted to the ADC 202 becomes smaller than normal, the error rate becomes an error rate E2. Therefore, by comparing the current packet error rate with the normal packet error rate, it is possible to detect the presence or absence of the occurrence of the failure.

It is preferable that the packet error rates are compared in a plurality of transmission/reception states by varying the reception power. That is, it is preferable that the normal packet error rate and the current packet error rate are compared at each power setting by varying the power setting by the VGA 2044. This makes it possible to more surely detect the occurrence of increase in the packet error rate by the failure.

While the invention made above by the present inventors has been described specifically based on the illustrated embodiments, the present invention is not limited thereto. It is needless to say that various changes and modifications can be made thereto without departing from the spirit and scope of the invention.

What is claimed is:

1. A wireless communication device comprising:
   a test signal generation unit;
   a test signal reception unit;
   a test signal determination unit;
   a first tested unit and a third tested unit which belong to a transmission side circuit;
   a second tested unit and a fourth tested unit which belong to a reception side circuit;
   a first test signal transfer unit which is coupled between the first tested unit and the second tested unit; and
   a second test signal transfer unit which is coupled between the third tested unit and the fourth tested unit,
   wherein the test signal generation unit generates a first test signal,
   wherein the first tested unit receives the first test signal from the test signal generation unit, and performs first processing for the first test signal to generate a second test signal,
   wherein the third tested unit receives the second test signal from the first tested unit, and performs third processing for the second test signal to generate a third test signal,
   wherein the fourth tested unit receives the third test signal from the third tested unit, and performs fourth processing for the third test signal to generate a fourth test signal,
   wherein the second tested unit receives the second test signal from the first tested unit via the first test signal transfer unit or the fourth signal from the fourth tested unit, and performs second processing for the second test signal or the fourth test signal to generate a fifth test signal,
   wherein the test signal reception unit receives the fifth test signal from the second tested unit, and
   wherein the test signal determination unit receives the first test signal from the test signal generation unit and the fifth test signal from the test signal reception unit, and determines whether or not the fifth test signal is normal based on the first test signal.

2. The wireless communication device according to claim 1, further comprising:
   a semiconductor chip including the first tested unit, the second tested unit, the third tested unit, the fourth tested unit, the first test signal transfer unit, and the second test signal transfer unit;
   a fifth tested unit which is coupled to the semiconductor chip and belongs to the transmission side circuit;
   a sixth tested unit which is coupled to the semiconductor chip and belongs to the reception side circuit; and
   a third test signal transfer unit which is coupled between the fifth tested unit and the sixth tested unit,
   wherein the fifth tested unit receives the third test signal from the third tested unit, and performs fifth processing for the third test signal to generate a sixth test signal,
   wherein the sixth tested unit receives the sixth test signal from the fifth tested unit via the third test signal transfer unit, and performs sixth processing for the sixth test signal to generate a seventh test signal, and
   wherein the fourth tested unit receives the seventh test signal from the sixth tested unit, and performs the fourth processing for the third test signal or the seventh test signal to generate the fourth test signal.

3. The wireless communication device according to claim 2, further comprising:
   a first circuit board including the semiconductor chip, the fifth tested unit, the sixth tested unit, and the third test signal transfer unit;
   a seventh tested unit which is coupled to the first circuit board and belongs to the transmission side circuit;
   an eighth tested unit which is coupled to the first circuit board and belongs to the reception side circuit;
   a fourth test signal transfer unit which is coupled between the seventh tested unit and the eighth tested unit;
   a transmission antenna which is coupled to the seventh tested unit; and
   a reception antenna which is coupled to the eighth tested unit,
   wherein the seventh tested unit receives the sixth test signal from the fifth tested unit, and outputs the sixth test signal received from the fifth tested unit as an eighth test signal,
   wherein the eighth tested unit receives the eighth test signal from the seventh tested unit via the fourth test signal transfer unit or the eighth test signal transmitted from the seventh tested unit via the transmission antenna and received by the reception antenna, and outputs the eighth test signal received via the fourth test signal transfer unit or the eighth test signal received by the reception antenna as a ninth test signal, and
   wherein the sixth tested unit receives the ninth test signal from the eighth tested unit, and performs the sixth processing for the sixth test signal or the ninth test signal to generate the seventh test signal.

4. The wireless communication device according to claim 1, further comprising:
   a circuit board where the semiconductor chip including the first tested unit, the second tested unit, the third tested unit, the fourth tested unit, the first test signal transfer unit, and the second test signal transfer unit are implemented,
   wherein the circuit board is provided with a shield for covering the semiconductor chip, and
   wherein the test signal determination unit further detects a spurious component included in the fifth test signal received from the test signal reception unit and thereby detects abnormality of the shield.

5. The wireless communication device according to claim 1, further comprising:

a rule notification unit notifying a generation rule of the first test signal to the test signal generation unit; and a rule determination unit determining whether or not the fifth test signal received by the test signal reception unit is a signal corresponding to the generation rule, wherein the test signal generation unit generates the first test signal in accordance with the generation rule notified from the rule notification unit.

6. The wireless communication device according to claim 5, wherein the generation rule stipulates a signal length of the first test signal.

7. The wireless communication device according to claim 5, wherein the generation rule stipulates a transmission time interval of the first test signal.

8. The wireless communication device according to claim 5, wherein the generation rule stipulates a generation timing of the first test signal.

9. The wireless communication device according to claim 5, wherein the rule determination unit further compares a packet error rate of the fifth test signal received by the test signal reception unit with a prescribed packet error rate.

10. The wireless communication device according to claim 1, further comprising:
a first failure detection unit comparing a consumption current or a power supply voltage of any one of the first, second, third and fourth tested units with a predetermined reference to detect a failure of the any one of the first, second, third and fourth tested units.

11. The wireless communication device according to claim 10, further comprising:
a voltage detection unit detecting a voltage of a power supply circuit coupled to an active circuit of any one of the first, second, third and fourth tested units, and
wherein the first failure detection unit detects a failure of the active circuit of the any one of the first, second, third and fourth tested units based on the voltage detected by the voltage detection unit.

12. The wireless communication device according to claim 11, wherein the first failure detection unit detects fluctuation of the voltage detected by the voltage detection unit and thereby detects a failure of a capacitor provided in the power supply circuit.

13. The wireless communication device according to claim 1, wherein when there is an error in the first k bits, where k is an integer equal to or greater than 1, of the fifth test signal received by the test signal reception unit, the test signal determination unit detects a failure of a capacitor in a power supply circuit coupled to an active circuit of any one of the first, second, third and fourth tested units.

14. The wireless communication device according to claim 1, further comprising:
a second failure detection unit detecting, based on whether or not an output signal of any one of the first, second, third and fourth tested units satisfies a predetermined condition, a failure of the any one of the first, second, third and fourth tested units.

15. The wireless communication device according to claim 3,
wherein the transmission antenna is provided on a second circuit board different from the first circuit board,
wherein the reception antenna is provided on a third circuit board different from the first circuit board,
wherein the seventh tested unit is a cable for coupling the first circuit board and the second circuit board, and wherein the eighth tested unit is a cable for coupling the first circuit board with the third circuit board.

16. The wireless communication device according to claim 1, further comprising:
a first power detection unit detecting power of the third test signal from the third tested unit; and
a transmission power determination unit determining whether or not the power detected by the first power detection unit is within a predetermined range.

17. The wireless communication device according to claim 16, further comprising:
a second power detection unit detecting power of the third test signal during the fourth processing in the fourth tested unit; and
a reception power determination unit for determining whether or not the power detected by the second power detection unit is within a predetermined range.

18. The wireless communication device according to claim 1, wherein the test signal determination unit further compares a bit length of the first test signal generated by the test signal generation unit with a bit length of the fifth test signal received from the test signal reception unit, and detects a failure of a capacitor corresponding to a magnitude of a difference between both the bit lengths when the bit length of the fifth test signal is longer than the bit length of the first test signal.

19. The wireless communication device according to claim 1,
wherein the first tested unit comprises a digital-to-analog converter, and performs, using a digital-to-analog conversion processing by the digital-to-analog converter, the first processing for the first test signal,
wherein the third tested unit comprises a transmission amplifier, and performs, using an amplification processing by the transmission amplifier, the third processing for the second test signal,
wherein the fourth tested unit comprises a reception amplifier, and performs, using an amplification processing by the reception amplifier, the fourth processing for the third test signal, and
wherein the second tested unit comprises an analog-to-digital converter, and performs, using an analog-to-digital conversion processing by the analog-to-digital converter, the fourth processing for the second test signal or the fourth test signal.

20. A determination method comprising the steps of:
inputting a first test signal to a first tested unit belonging to a transmission side circuit;
inputting a second test signal which is outputted by the first tested unit to a second tested unit belonging to a reception side circuit;
inputting the second test signal to a third tested unit belonging to the transmission side circuit;
inputting a third test signal which is outputted by the third tested unit to a fourth tested unit belonging to the reception side circuit;
inputting a fourth test signal which is outputted by the fourth tested unit to the second tested unit; and
determining whether or not a fifth test signal which is outputted by the second tested unit is normal based on the first test signal.

* * * * *